(12) United States Patent
Lee et al.

(10) Patent No.: US 11,557,631 B2
(45) Date of Patent: Jan. 17, 2023

(54) SEMICONDUCTOR DEVICE HAVING FIRST MEMORY SECTION AND SECOND MEMORY SECTION

(71) Applicant: Samsung Electronics Co., Ltd., Suwon-si (KR)

(72) Inventors: Kilho Lee, Busan (KR); Gwanhyeob Koh, Seoul (KR); Ilmok Park, Seoul (KR); Junhee Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/088,168

(22) Filed: Nov. 3, 2020

(65) Prior Publication Data

US 2021/0134884 A1 May 6, 2021

Related U.S. Application Data

(63) Continuation of application No. 16/010,447, filed on Jun. 16, 2018, now Pat. No. 10,861,902, which is a
(Continued)

(30) Foreign Application Priority Data

Jun. 13, 2017 (KR) ........................ 10-2017-0074370
Aug. 14, 2017 (KR) ........................ 10-2017-0103249

(51) Int. Cl.
*H01L 27/24* (2006.01)
*H01L 27/1157* (2017.01)
(Continued)

(52) U.S. Cl.
CPC ............ *H01L 27/249* (2013.01); *G11C 5/025* (2013.01); *G11C 11/1655* (2013.01);
(Continued)

(58) Field of Classification Search
CPC .............. H01L 27/2427; H01L 27/249; G11C 14/0018; G11C 14/0063; G11C 5/025; G11C 16/0483
See application file for complete search history.

(56) References Cited

U.S. PATENT DOCUMENTS 5,590,073 A 12/1996 Arakawa et al.
6,097,625 A 8/2000 Scheuerlein
(Continued)

FOREIGN PATENT DOCUMENTS

CN 1242606 A 1/2000
CN 101055876 A 10/2007
(Continued)

OTHER PUBLICATIONS

Office Action for U.S. Appl. No. 16/411,106 dated May 1, 2020.
(Continued)

*Primary Examiner* — Vanthu T Nguyen
(74) *Attorney, Agent, or Firm* — Harness, Dickey & Pierce, P.L.C.

(57) ABSTRACT

Disclosed is a semiconductor device including first conductive lines, second conductive lines crossing the first conductive lines, and memory cells at intersections between the first conductive lines and the second conductive lines. Each of the memory cells includes a magnetic tunnel junction pattern, a bi-directional switching pattern connected in series to the magnetic tunnel junction pattern, and a conductive pattern between the magnetic tunnel junction pattern and the bi-directional switching pattern.

20 Claims, 26 Drawing Sheets

Related U.S. Application Data continuation-in-part of application No. 15/854,551, filed on Dec. 26, 2017, now Pat. No. 10,373,653.

(51) Int. Cl.

| | | |
|---|---|---|
| *G11C 11/16* | (2006.01) | |
| *H01L 27/11582* | (2017.01) | |
| *H01L 27/11573* | (2017.01) | |
| *H01L 27/22* | (2006.01) | |
| *H01L 27/11575* | (2017.01) | |
| *G11C 14/00* | (2006.01) | |
| *G11C 5/02* | (2006.01) | |
| *G11C 16/04* | (2006.01) | |

(52) U.S. Cl.
CPC ...... *G11C 14/0018* (2013.01); *G11C 14/0063* (2013.01); *G11C 16/0483* (2013.01); *H01L 27/1157* (2013.01); *H01L 27/11573* (2013.01); *H01L 27/11575* (2013.01); *H01L 27/11582* (2013.01); *H01L 27/224* (2013.01); *H01L 27/2463* (2013.01); *H01L 27/2481* (2013.01); *G11C 2213/71* (2013.01)

(56) References Cited

U.S. PATENT DOCUMENTS

| | | | |
|---|---|---|---|
| 6,839,260 | B2 | 1/2005 | Ishii |
| 7,280,397 | B2 | 10/2007 | Scheuerlein |
| 7,336,519 | B2 | 2/2008 | Ishii |
| 7,372,140 | B2 | 5/2008 | Lee |
| 7,423,898 | B2 | 9/2008 | Tanizaki et al. |
| 7,505,330 | B2 | 3/2009 | Pawlowski et al. |
| 8,036,018 | B2 | 10/2011 | Koh et al. |
| 8,489,843 | B2 | 7/2013 | Leung |
| 8,716,805 | B2 | 5/2014 | Fujita |
| 8,735,902 | B2 | 5/2014 | Tang et al. |
| 8,760,920 | B2 | 6/2014 | Kim et al. |
| 8,829,590 | B2 | 9/2014 | Park |
| 8,951,859 | B2 * | 2/2015 | Higashitani ....... H01L 27/11565 438/738 |
| 9,001,546 | B2 | 4/2015 | Chen et al. |
| 9,006,848 | B2 | 4/2015 | Park |
| 9,041,146 | B2 | 5/2015 | Lee et al. |
| 9,070,587 | B2 | 6/2015 | Hwang et al. |
| 9,105,333 | B1 | 8/2015 | Hu et al. |
| 9,208,883 | B2 | 12/2015 | Alsmeier |
| 9,337,239 | B2 | 5/2016 | Lee |
| 9,478,739 | B2 | 10/2016 | Kim |
| 9,502,471 | B1 | 11/2016 | Lu et al. |
| 9,530,822 | B2 | 12/2016 | Shukh |
| 9,535,831 | B2 | 1/2017 | Jayasena et al. |
| 9,543,512 | B2 | 1/2017 | Ohba et al. |
| 9,564,586 | B2 | 2/2017 | Ha |
| 9,583,697 | B2 | 2/2017 | Kim et al. |
| 9,627,438 | B1 | 4/2017 | Satoh et al. |
| 9,704,921 | B2 | 7/2017 | Kim et al. |
| 9,720,828 | B2 | 8/2017 | Yoon et al. |
| 9,780,144 | B2 | 10/2017 | Seong et al. |
| 10,008,265 | B2 | 6/2018 | Hsu |
| 2006/0145337 | A1 | 7/2006 | Lee |
| 2007/0247887 | A1 | 10/2007 | Park |
| 2008/0083924 | A1 | 4/2008 | Song et al. |
| 2009/0302394 | A1 | 12/2009 | Fujita |
| 2010/0032641 | A1 | 2/2010 | Mikawa et al. |
| 2011/0044093 | A1 | 2/2011 | Koh et al. |
| 2011/0228603 | A1 | 9/2011 | Takashima |
| 2012/0092935 | A1 | 4/2012 | Kim et al. |
| 2013/0140515 | A1 | 6/2013 | Kawashima et al. |
| 2013/0334632 | A1 | 12/2013 | Park |
| 2014/0027706 | A1 | 1/2014 | Chien et al. |
| 2014/0085979 | A1 * | 3/2014 | Kono ................ H01L 27/1157 365/185.11 |
| 2014/0117304 | A1 | 5/2014 | Park |
| 2014/0264679 | A1 | 9/2014 | Lee et al. |
| 2014/0291598 | A1 | 10/2014 | Hwang |
| 2015/0207066 | A1 | 7/2015 | Ohba et al. |
| 2015/0249096 | A1 | 9/2015 | Lupino et al. |
| 2015/0249203 | A1 | 9/2015 | Yoon et al. |
| 2016/0005963 | A1 | 1/2016 | Kim |
| 2016/0043142 | A1 | 2/2016 | Hong et al. |
| 2016/0118442 | A1 | 4/2016 | Kim et al. |
| 2016/0247565 | A1 | 8/2016 | Perner et al. |
| 2016/0329491 | A1 | 11/2016 | Ha |
| 2017/0110513 | A1 | 4/2017 | Lee |
| 2018/0204881 | A1 | 7/2018 | Sei et al. |
| 2018/0294408 | A1 | 10/2018 | Yasuda et al. |

FOREIGN PATENT DOCUMENTS

| | | |
|---|---|---|
| CN | 105374933 A | 3/2016 |
| JP | 2010/225211 A | 10/2010 |
| JP | 6151650 B2 | 6/2017 |
| KR | 20090009457 A | 1/2009 |
| KR | 101022580 B1 | 3/2011 |
| KR | 10-2012-0012728 A | 2/2012 |
| KR | 20130139692 A | 12/2013 |
| KR | 10-2014-0116264 A | 10/2014 |
| KR | 10-2014-0118177 A | 10/2014 |
| KR | 10-2015-0057696 A | 5/2015 |
| KR | 20150103527 A | 9/2015 |
| KR | 20160004525 A | 1/2016 |
| KR | 20160020890 A | 2/2016 |
| KR | 20160049299 A | 5/2016 |
| KR | 101642161 B1 | 8/2016 |
| KR | 20160131180 A | 11/2016 |
| KR | 20170045871 A | 4/2017 |
| TW | I483263 B | 5/2015 |
| TW | 201535378 A | 9/2015 |

OTHER PUBLICATIONS

Final Office Action for U.S. Appl. No. 15/854,551, dated Dec. 31, 2018.

Office Action for U.S. Appl. No. 15/854,551 dated Jul. 26, 2018.

* cited by examiner

SEMICONDUCTOR DEVICE HAVING FIRST MEMORY SECTION AND SECOND MEMORY SECTION

CROSS-REFERENCE TO RELATED APPLICATION

This application is a continuation of U.S. patent application Ser. No. 16/010,447, filed on Jun. 16, 2018, which is a continuation-in-part of U.S. patent application Ser. No. 15/854,551, filed on Dec. 26, 2017, which claims priority under 35 U.S.C § 119 to Korean Patent Application No. 10-2017-0074370, filed on Jun. 13, 2017 in the Korean Intellectual Property Office. This application also claims priority under 35 U.S.C § 119 to Korean Patent Application No. 10-2017-0103249, filed on Aug. 14, 2017. The disclosures of these applications are incorporated herein by reference in their entirety.

TECHNICAL FIELD

The present inventive concepts relate to a semiconductor device.

DISCUSSION OF RELATED ART

Semiconductor devices include memory devices and logic devices. The memory devices for storing data can be classified as volatile memory devices and nonvolatile memory devices. The volatile memory devices, such as DRAM (Dynamic Random Access Memory) and SRAM (Static Random Access Memory), lose stored data when their power supply is interrupted. The nonvolatile memory devices, such as PROM (programmable ROM), EPROM (erasable PROM), EEPROM (electrically EPROM), and Flash memory device, do not lose stored data even when their power supply is inhibited.

Magnetic memory devices have recently been developed to meet the trend of high performance and low power consumption of semiconductor memory devices. Since magnetic memory devices operate at high speed and have nonvolatile characteristics, they have attracted considerable attention as the next-generation semiconductor memory devices.

SUMMARY

Some embodiments of the present inventive concepts provide a semiconductor device having enhanced characteristics of magnetic tunnel junction pattern and improved integration. An object of the present inventive concepts is not limited to the above-mentioned one.

According to exemplary embodiments of the present inventive concepts, a semiconductor device may comprise: a plurality of first conductive lines: a plurality of second conductive lines crossing the plurality of first conductive lines; and a plurality of memory cells at intersections between the plurality of first conductive tines and the plurality of second conductive lines. Each of the plurality of memory cells may comprise: a magnetic tunnel junction pattern; a bi-directional switching pattern connected in series to the magnetic tunnel junction pattern; and a conductive pattern between the magnetic tunnel junction pattern and the bi-directional switching pattern.

According to exemplary embodiments of the present inventive concepts, a semiconductor device may comprise: a first conductive line on a substrate; a second conductive line on the first conductive line and crossing the first conductive line; a magnetic tunnel junction pattern and a bi-directional switching pattern that are coupled in series between the first conductive line and the second conductive line; and a conductive pattern between the magnetic tunnel junction pattern and the bi-directional switching pattern. The bi-directional switching pattern comprises a chalcogen element.

BRIEF DESCRIPTION OF THE DRAWINGS

These and other features of the present inventive concepts will become more apparent by describing in detail exemplary embodiments thereof with reference to the accompanying drawings of which.

DETAILED DESCRIPTION OF EXEMPLARY EMBODIMENTS

Figure 1:
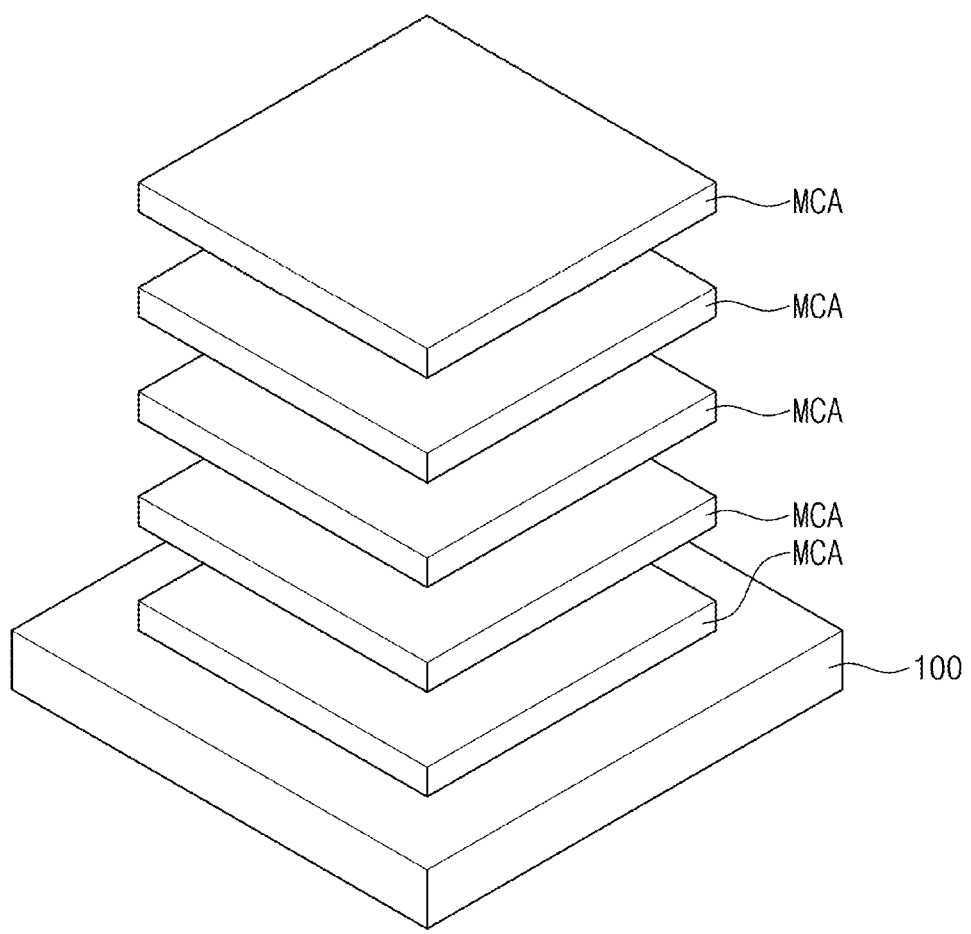
FIG. 1 illustrates a schematic diagram showing a memory cell array of a semiconductor device according to exemplary embodiments of the present inventive concepts.

Exemplary embodiments of inventive concepts will be described below in detail with reference to the accompanying drawings. However, the inventive concepts may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 illustrates a schematic diagram showing a memory cell array of a semiconductor device according to exemplary embodiments of the present inventive concepts.

Referring to FIG. 1, a semiconductor device may include a plurality of memory cell stacks MCA sequentially stacked on a substrate 100. Each of the memory cell stacks MCA may include a plurality of memory cells that are two-dimensionally arranged. The semiconductor device may include a plurality of conductive lines that lie between the memory cell stacks MCA and configure the memory cells to perform writing, reading, and/or erasing operations. FIG. 1 shows five memory cell stacks MCA, but exemplary embodiments of the present inventive concepts are not limited thereto.

Figure 2:
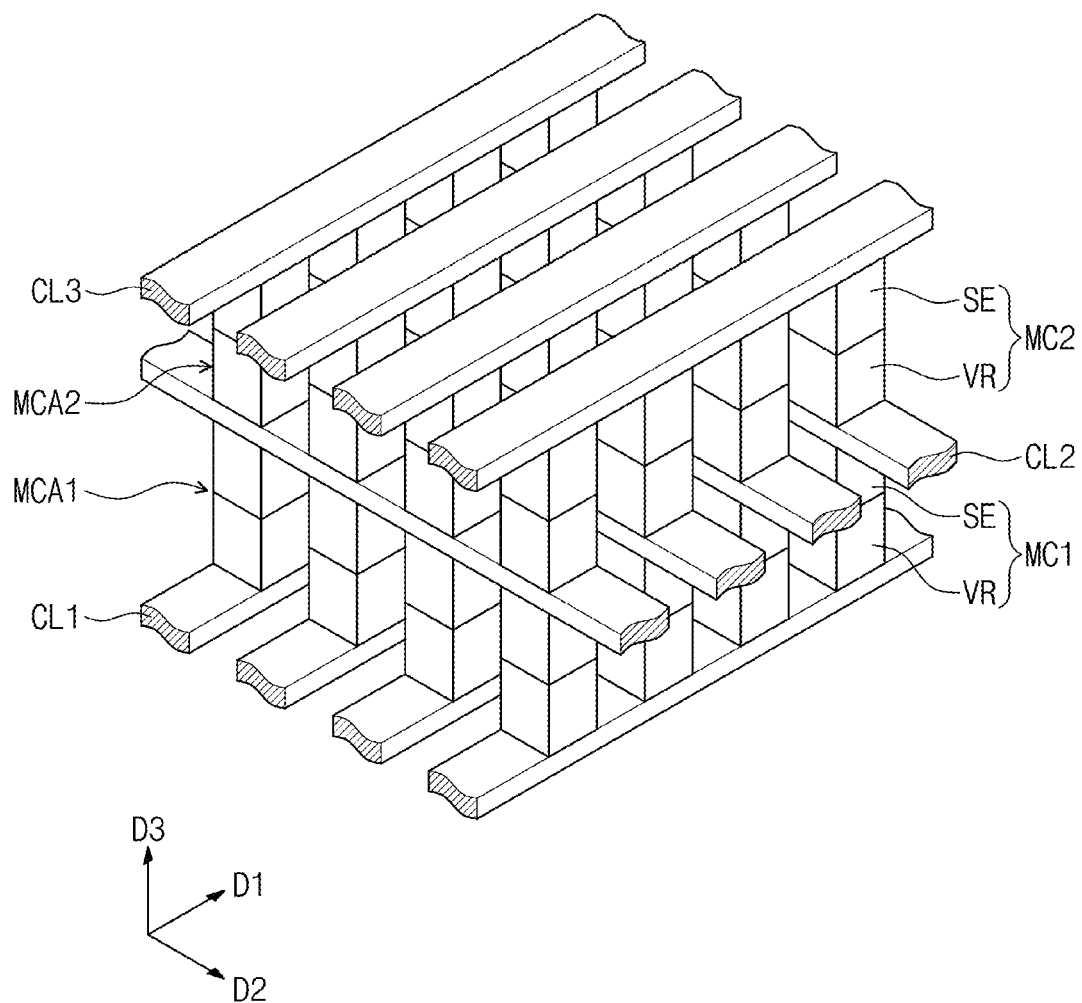
FIG. 2 illustrates a simplified perspective view showing a memory cell array of a semiconductor device according to exemplary embodiments of the present inventive concepts.

FIG. 2 illustrates a simplified perspective view showing a memory cell array of a semiconductor device according to exemplary embodiments of the present inventive concepts. FIG. 2 shows an example that includes two memory cell stacks MCA1 and MCA2 adjacent to each other, but the present inventive concepts are not limited thereto.

Referring to FIG. 2, a semiconductor device may include first conductive lines CL1 extending in a first direction D1, second conductive lines CL2 extending in a second direction D2 crossing the first direction D1, and third conductive lines CL3 extending in the first direction D1. The first, second, and third conductive lines CL1, CL2, and CL3 may be sequentially provided along a third direction D3 perpendicular to the first and second directions D1 and D2, for example.

A first memory cell stack MCA1 may be provided between the first conductive lines CL1 and the second conductive lines CL2, and a second memory cell stack MCA2 may be provided between the second conductive line CL2 and the third conductive lines CL3. The first memory cell stack MCA1 may include first memory cells MC1 that are correspondingly provided at intersections between the first conductive lines CL1 and the second conductive lines CL2. The first memory cells MC1 may be two-dimensionally arranged in a row-and-column fashion. The second memory cell stack MCA2 may include second memory cells MC2 that are correspondingly provided at intersections between the second conductive lines CL2 and the third conductive lines CL3. The second memory cells MC2 may be two-dimensionally arranged in a row-and-column fashion.

Each of the first and second memory cells MC1 and MC2 may include a variable resistance element VR and a select element SE. The variable resistance element VR and the select element SE may be coupled in series between a pair of their corresponding conductive lines CL1, CL2, and CL3. For example, the variable resistance element VR and the select element. SE included in each of the first memory cells MC1 may be coupled in series between a pair of a corresponding first conductive line CL1 and a corresponding second conductive line CL2, and the variable resistance element VR and the select element SE included in each of the second memory cells MC2 may be coupled in series between a corresponding second conductive line CL2 and a corresponding third conductive line CL3. FIG. 2 shows that the select element SE is provided on the variable resistance element VR, but the present inventive concepts are not limited thereto. For example, differently from that shown in FIG. 2, the variable resistance element. VR may be placed above the select element. SE.

Figure 3:
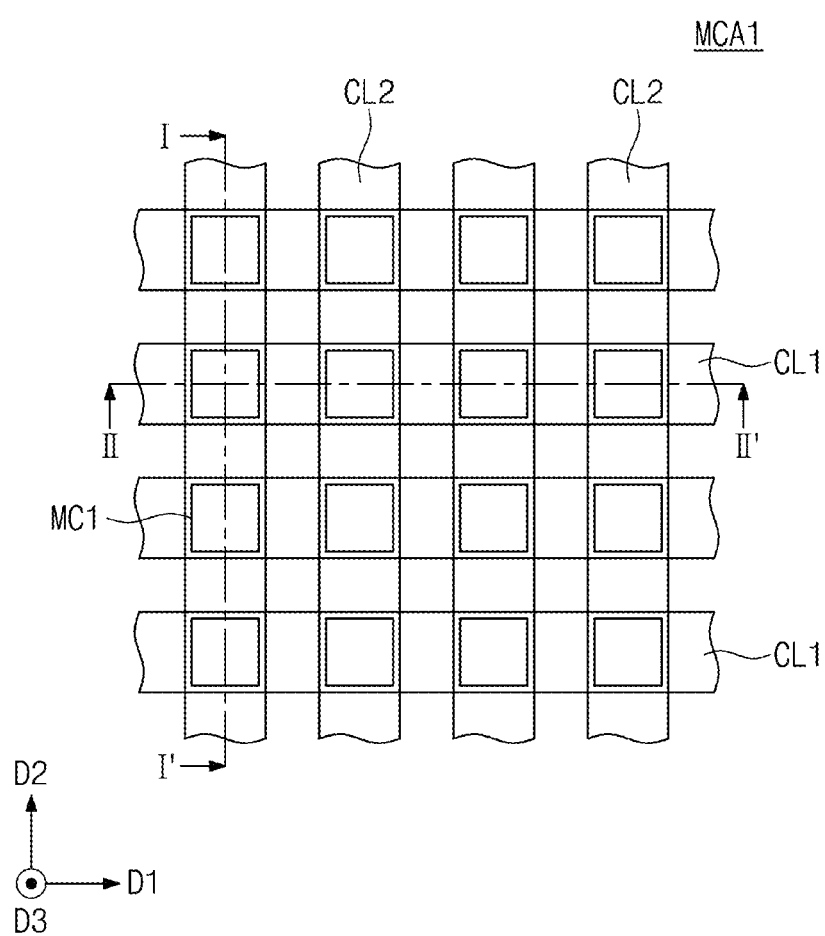
FIG. 3 illustrates a plan view showing a memory cell array of a semiconductor device according to exemplary embodiments of the present inventive concepts.
Figure 4:
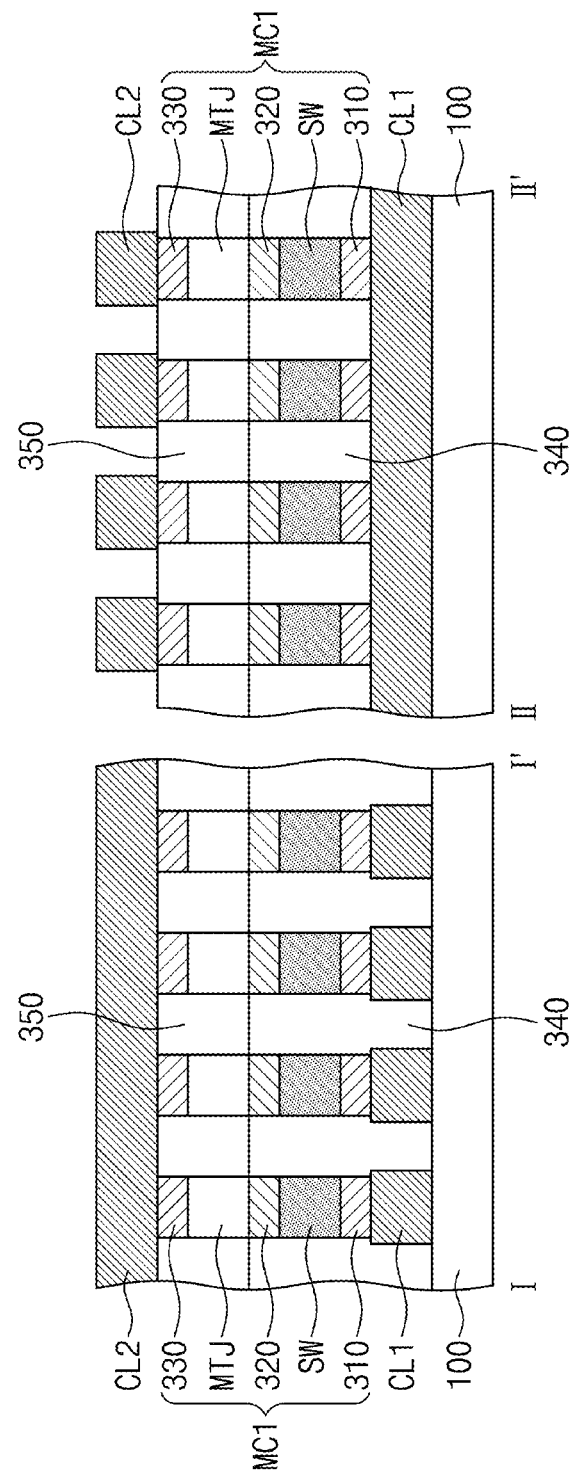
FIG. 4 illustrates a cross-sectional view taken along lines I-I' and II-II' of FIG. 3.
Figure 5A:
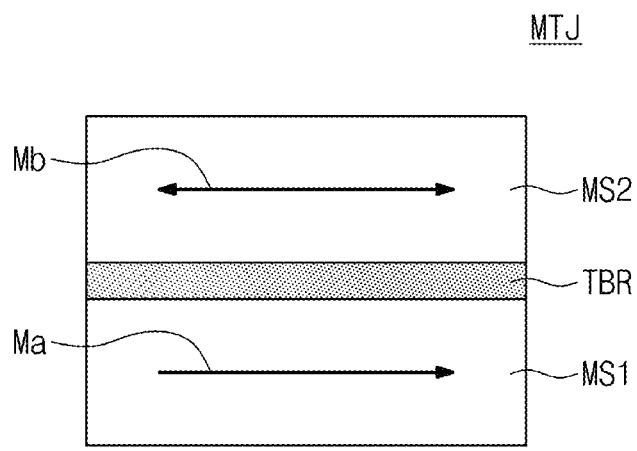
FIGS. 5A and 5B illustrate cross-sectional views showing examples of a magnetic tunnel junction pattern according to exemplary embodiments of the present inventive concepts.
Figure 5B:
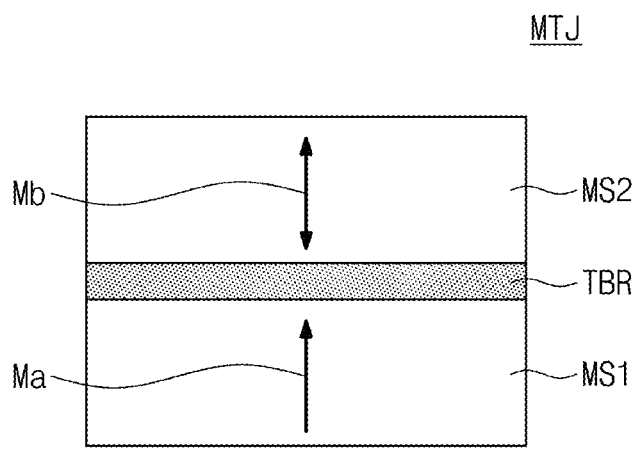

FIG. 3 illustrates a plan view showing a memory cell array of a semiconductor device according to exemplary embodiments of the present inventive concepts. FIG. 4 illustrates a cross-sectional view taken along lines I-I' and II-II' of FIG. 3. FIGS. 5A and 5B illustrate cross-sectional views showing examples of a magnetic tunnel junction pattern according to exemplary embodiments of the present inventive concepts. For brevity of description, the first memory cell stack MCA1 is selectively chosen to describe in detail a memory cell array of a semiconductor device according to exemplary embodiments of the present inventive concepts.

Referring to FIGS. 3 and 4, a substrate 100 may be provided thereon with a plurality of first conductive lines CL1 and a plurality of second conductive lines CL2. The first conductive lines CL1 may extend in a first direction D1 and be spaced apart from each other in a second direction D2. The second conductive lines CL2 may be spaced apart from the first conductive lines CL1 along a third direction D3 perpendicular to the first and second directions D1 and D2. The second conductive lines CL2 may extend in the second direction D2 and be spaced apart from each other in the first direction D1. The first conductive lines CL1 and the second conductive lines CL2 may include metal (e.g., copper, tungsten, or aluminum) or metal nitride (e.g., tantalum nitride, titanium nitride, or tungsten nitride).

A plurality of first memory cells MC1 may be correspondingly disposed at intersections between the first conductive lines CL1 and the second conductive lines CL2. The first memory cells MC1 may be two-dimensionally arranged along the first and second directions D1 and D2. The first memory cells MC1 may constitute a first memory stack MCA1. Although only one memory cell stack MCA1 is illustrated for convenience of description, a plurality of memory cell stacks may be stacked along the third direction D3 on the substrate 100. Accordingly, the substrate 100 may be provided thereon with repeatedly stacked structures corresponding to the first memory cell stack MCA1 and the first and second conductive lines CL1 and CL2.

Each of the first memory cells MC1 may include a magnetic tunnel junction pattern MTJ and a bi-directional switching pattern SW that are coupled in series between a corresponding first conductive line CL1 and a corresponding second conductive line CL2. The magnetic tunnel junction pattern MTJ and the bi-directional switching pattern SW may respectively correspond to the variable resistance element. VR and the select element SE discussed with reference to FIG. 2. In some embodiments, the magnetic tunnel junction pattern MTJ may be provided between the bi-directional switching pattern SW and the corresponding second conductive line CL2, and the bi-directional switching pattern SW may be provided between the magnetic tunnel junction pattern MTJ and the corresponding first conductive line CL1. The magnetic tunnel junction pattern MTJ may be shaped like, for example, an island confined at an intersection between the corresponding first conductive line CL1 and the corresponding second conductive line CL2. The bi-directional switching pattern SW may be shaped like, for example, an island confined at an intersection between the corresponding first conductive line CL1 and the corresponding second conductive line CL2. Alternatively, differently from that shown, the bi-directional switching pattern SW may be shaped like a line elongated either in the first direction D1 or in the second direction D2. In this case, the bi-directional switching pattern SW may be shared between a plurality of first memory cells MC1 that are arranged either along the first direction D1 or along the second direction D2.

The bi-directional switching pattern SW may be a device based on a threshold switching phenomenon exhibiting a nonlinear I-V curve (e.g., S-type I-V curve). For example, the bi-directional switching pattern SW may be an OTS (Ovonic Threshold Switch) device exhibiting bi-directional characteristics. At least a portion of the bi-directional switching pattern SW may be in an amorphous state. The bi-directional switching pattern SW may be in a substantially amorphous state. In this description, the phrase substantially amorphous state may not exclude the presence of a locally crystalline grain boundary or a locally crystalline portion in an object (e.g., the bi-directional switching pattern SW). The bi-directional switching pattern SW may include a chalcogenide material. The chalcogenide material may include a compound in which one or more of Te and Se (chalcogen elements) are combined with one or more of Ge, Sb, Bi, Al, Pb, Sn, Ag, As, S, Si, in, Ti, Ga, and P. For example, the chalcogenide material may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe. The bi-directional switching pattern SW may include a chalcogenide material of which at least a portion is amorphous. In some embodiments, the bi-directional switching pattern SW may further include an impurity, for example, one or more of C, N, B, and O.

Referring to FIGS. 5A and 5B, the magnetic tunnel junction pattern MTJ may include a first magnetic structure MS1, a second magnetic structure MS2, and a tunnel barrier pattern TBR between the first and second magnetic structures MS1 and MS2. The first magnetic structure MS1 may include a reference layer of which a magnetization direction Ma is fixed in one direction, and the second magnetic structure MS2 may include a free layer of which a magnetization direction Mb is variable to be parallel or antiparallel to the magnetization direction Ma of the reference layer. Differently from those shown in FIGS. 5A and 5B, the first magnetic structure MS1 may include the free layer, and the second magnetic structure MS2 may include the reference layer.

Referring to FIG. 5A, the magnetic tunnel junction pattern MTJ may have a horizontal (or longitudinal) magnetization. In this case, the magnetization directions Ma and Mb of the reference and free layers may be substantially parallel to an interface between the tunnel barrier pattern TBR and the first magnetic structure MS1. For example, each of the reference and free layers may include a ferromagnetic material. The reference layer may further include an anti-ferromagnetic material that fixes a magnetization direction of the ferromagnetic material.

Referring to FIG. 5B, the magnetic tunnel junction pattern MTJ may have a perpendicular magnetization. In this case, the magnetization directions Ma and Mb of the reference and free layers may be substantially perpendicular to an interface between the tunnel barrier pattern TBR and the first magnetic structure MS1. For example, each of the reference and free layers may include one or more of a perpendicular magnetic material (e.g., CoFeTb, CoFeGd, CoFeDy), a perpendicular magnetic material having an $L_{10}$ structure, CoPt of a hexagonal close packed (HCP) lattice structure, and a perpendicular magnetization structure. The perpendicular magnetic material having the $L_{10}$ structure may include one or more of FePt of the $L_{10}$ structure, FePd of the $L_{10}$ structure, CoPd of the $L_{10}$ structure, and CoPt of the $L_{10}$ structure. The perpendicular magnetization structure may include magnetic layers and non-magnetic layers that are alternately and repeatedly stacked. For example, the perpendicular magnetization structure may include one or more of $(Co/Pt)n$, $(CoFe/Pt)n$, $(CoFe/Pd)n$, $(Co/Pd)n$, $(Co/Ni)n$, $(CoNi/Pt)n$, $(CoCr/Pt)n$, and $(CoCr/Pd)n$ (where n is the stack number). Herein, the reference layer may have a thickness greater than that of the free layer or have a coercive force greater than that of the free layer.

Referring back to FIGS. 3 and 4, in some embodiments, each of the first memory cells MC1 may include a first conductive pattern 310 between the corresponding first conductive line CL1 and the bi-directional switching pattern SW, a second conductive pattern 320 between the magnetic tunnel junction pattern MTJ and the bi-directional switching pattern SW, and a third conductive pattern 330 between the corresponding second conductive line CL2 and the magnetic tunnel junction pattern MTJ.

The bi-directional switching pattern SW may be connected, or electrically coupled, through the first conductive pattern 310 to the corresponding first conductive line CL1. The first conductive pattern 310 may be spaced apart from the second conductive pattern 320 across the bi-directional switching pattern SW. The first conductive pattern 310 may be shaped like, for example, an island confined at an intersection between the corresponding first conductive line CL1 and the corresponding second conductive line CL2. Alternatively, differently from that shown, the first conductive pattern 310 may be shaped like a line elongated in an extending direction (e.g., the first direction D1) of the corresponding first conductive line CL1. In this case, the first conductive pattern 310 may be shared between a plurality of first memory cells MC1 that are arranged in the extending direction (e.g., the first direction D1) of the corresponding first conductive line CL1. The magnetic tunnel junction pattern MTJ may be connected, or electrically coupled, through the third conductive pattern 330 to the corresponding second conductive line CL2. The third conductive pattern 330 may be spaced apart from the second conductive pattern 320 across the magnetic tunnel junction pattern MTJ. The third conductive pattern 330 may be shaped like an island confined at an intersection between the corresponding first conductive line CL1 and the corresponding second conductive line CL2. The first conductive pattern 310 and the third conductive pattern 330 may include metal or metal nitride. For example, the first conductive pattern 310 and the third conductive pattern 330 may include one or more of W, Ti, Al, Cu, C, CN, TiN, TiAlN, TiSiN, TiCN, WN, CoSiN, WSiN, TaN, TaCN, TaSiN, and TiO. In this description, the first conductive pattern 310 and the third conductive pattern 330 may also be respectively called a first electrode and a second electrode.

The second conductive pattern 320 may electrically connect the magnetic tunnel junction pattern MTJ and the bi-directional switching pattern SW to each other, and may prevent direct contact between the magnetic tunnel junction pattern MTJ and the bi-directional switching pattern SW. The second conductive pattern 320 may serve to prevent constituent elements of the magnetic tunnel junction pattern MTJ and the bi-directional switching pattern SW from diffusing between the magnetic tunnel junction pattern MTJ and the bi-directional switching pattern SW. The diffusion of the elements may deteriorate characteristics of the magnetic tunnel junction pattern MTJ and the bi-directional switching pattern SW. The second conductive pattern 320 may suppress the diffusion of the elements, thereby minimizing or reducing deterioration in characteristics of the magnetic tunnel junction pattern MTJ and the bi-directional switching pattern SW. At least a portion of the second conductive pattern 320 may be in an amorphous state. The second conductive pattern 320 may include metal nitride (e.g., TaN). The second conductive pattern 320 may further include an impurity (e.g., carbon).

The substrate 100 may be provided thereon with a lower interlayer dielectric layer 340. The lower interlayer dielectric layer 340 may cover the first conductive lines CL1, and further cover the first conductive pattern 310, the bi-directional switching pattern SW, and the second conductive pattern 320 that are included in each of the first memory cells MC1. The lower interlayer dielectric layer 340 may be provided thereon with an upper interlayer dielectric layer 350. The upper interlayer dielectric layer 350 may cover the magnetic tunnel junction pattern MTJ and the third conductive pattern 330 that are included in each of the first memory cells MC1. The second conductive lines CL2 may be provided on the upper interlayer dielectric layer 350. The lower interlayer dielectric layer 340 and the upper interlayer dielectric layer 350 may include one or more of silicon oxide, silicon nitride, and silicon oxynitride.

In some embodiments, the bi-directional switching pattern SW may be formed by forming a switching layer on the substrate 100 and then patterning the switching layer. In this case, after the switching layer is patterned, at least a portion of the lower interlayer dielectric layer 340 may be formed to cover the bi-directional switching pattern SW. In other embodiments, a recess region may be formed in the lower interlayer dielectric layer 340 and then filled with the bi-directional switching pattern SW. The magnetic tunnel junction pattern MTJ may be formed by forming a magnetic tunnel junction layer on the lower interlayer dielectric layer 340 and then patterning the magnetic tunnel junction layer. In this case, after the magnetic tunnel junction layer is patterned, at least a portion of the upper interlayer dielectric layer 350 may be formed to cover the magnetic tunnel junction pattern MTJ.

When a manufacturing process for a semiconductor device including the magnetic tunnel junction pattern MTJ is performed at a relatively high temperature, constituent elements of the magnetic tunnel junction pattern MTJ may diffuse into neighboring layers (or patterns), and thus the magnetic tunnel junction pattern MTJ may deteriorate in characteristics. Accordingly, it may be required that the manufacturing process for a semiconductor device including the magnetic tunnel junction pattern MTJ be performed at a relatively low temperature.

The bi-directional switching pattern SW may have a phase change transition temperature between a crystalline state and an amorphous state. The phase change temperature may fall within a range from about 350° C. to about 450° C. The bi-directional switching pattern SW may maintain its substantially amorphous state during the time when the manufacturing process for a semiconductor device is performed at a relatively lower temperature than the phase change transition temperature, thereby having bi-directional switching characteristics.

According to the present inventive concepts, the magnetic tunnel junction pattern MTJ and the bi-directional switching pattern SW may be coupled in series between the corresponding first conductive line CL1 and the corresponding second conductive line CL2, and the bi-directional switching pattern SW may exhibit bi-directional switching characteristics at a relatively low temperature. Accordingly, it may be possible to minimize or reduce deterioration in characteristics of the magnetic tunnel junction pattern MTJ and to provide a semiconductor device having increased integration.

Figure 6:
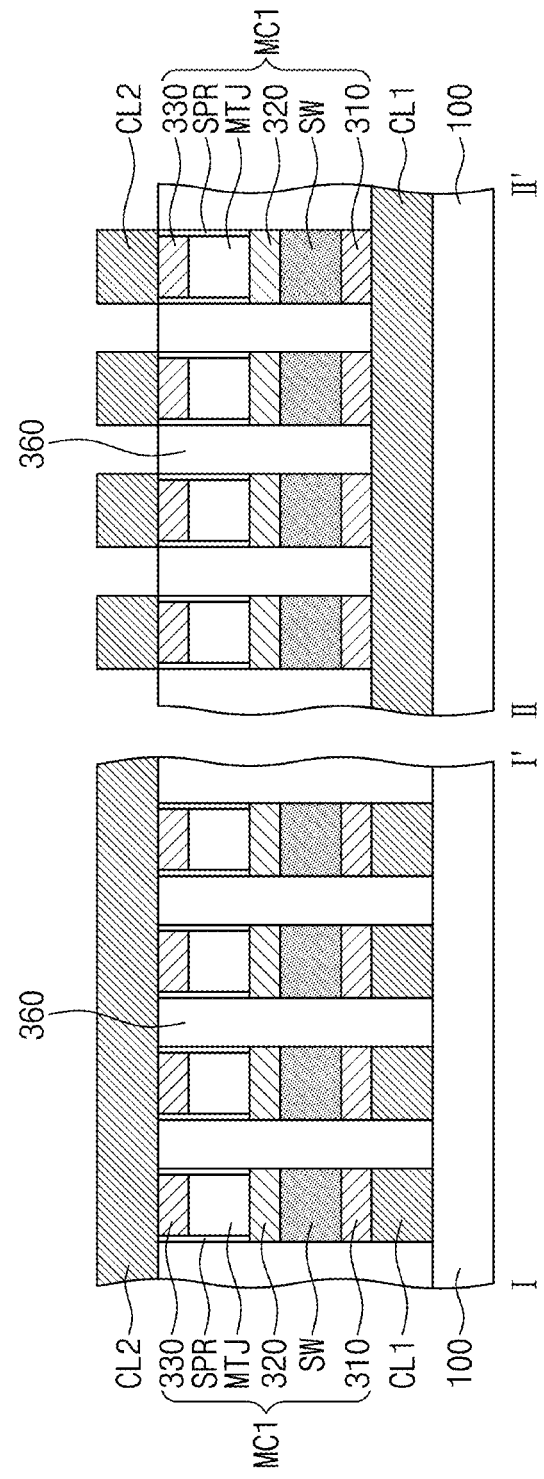
FIG. 6 illustrates a cross-sectional view taken along lines I-I' and II-II' of FIG. 3, showing a memory cell array of a semiconductor device according to exemplary embodiments of the present inventive concepts.

FIG. 6 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 6, each of the first memory cells MC1 may include the magnetic tunnel junction pattern MTJ and the bi-directional switching pattern SW that are coupled in series between the corresponding first conductive line CL1 and the corresponding second conductive line CL2. Each of the first memory cells MC1 may include the first conductive pattern 310 between the corresponding first conductive line CL1 and the bi-directional switching pattern SW, the second conductive pattern 320 between the magnetic tunnel junction pattern MTJ and the bi-directional switching pattern SW, and the third conductive pattern 330 between the corresponding second conductive line CL2 and the magnetic tunnel junction pattern MTJ. According to the present embodiment, each of the first memory cells MC1 may include spacer patterns SPR on sidewalls of the magnetic tunnel junction pattern MTJ. The spacer patterns SPR may include an insulating material. The substrate 100 may be provided thereon with an interlayer dielectric layer 360. The interlayer dielectric layer 360 may cover the first conductive lines CL1 and the first memory cells MC1. The second conductive lines CL2 may be provided on the interlayer dielectric layer 360.

The magnetic tunnel junction pattern MTJ may be formed by forming a magnetic tunnel junction layer on the substrate 100 and then patterning the magnetic tunnel junction layer. After the magnetic tunnel junction layer is patterned, the spacer patterns SPR may be formed to cover the sidewalls of the magnetic tunnel junction pattern MTJ. The spacer patterns SPR may serve to prevent deterioration of the magnetic tunnel junction pattern MTJ during a subsequent patterning process (e.g., a patterning process for forming the bi-directional switching pattern SW).

Figure 7:
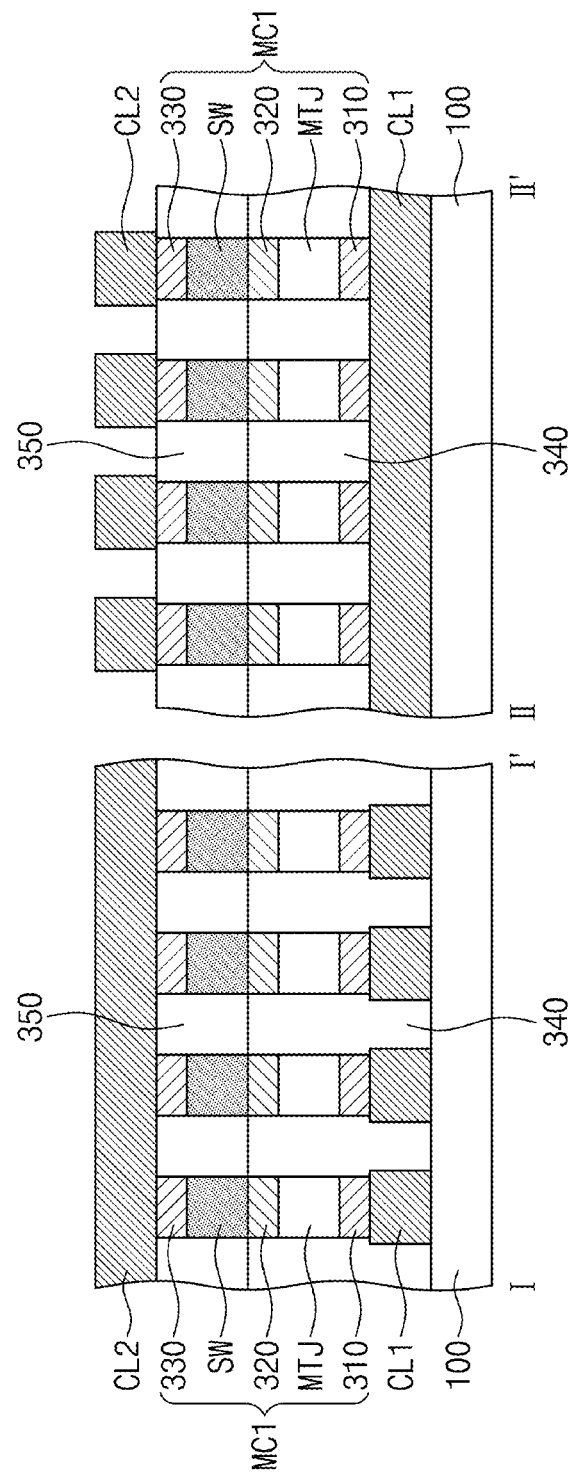
FIG. 7 illustrates a cross-sectional view taken along lines I-I' and II-II' of FIG. 3, showing a memory cell array of a semiconductor device according to exemplary embodiments of the present inventive concepts.

FIG. 7 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 7, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the magnetic tunnel junction pattern MTJ may be provided between the bi-directional switching pattern SW and the corresponding first conductive line CL1, and the bi-directional switching pattern SW may be provided between the magnetic tunnel junction pattern MTJ and the corresponding second conductive line CL2. Each of the first memory cells MC1 may include the first conductive pattern 310 between the corresponding first conductive line CL1 and the magnetic tunnel junction pattern MTJ, the second conductive pattern 320 between the magnetic tunnel junction pattern MTJ and the bi-directional switching pattern SW, and the third conductive pattern 330 between the corresponding second conductive line CL2 and the bi-directional switching pattern SW. The substrate 100 may be provided thereon with the lower interlayer dielectric layer 340, which covers the first conductive lines CL1 and further covers the first conductive pattern 310, the magnetic tunnel junction pattern MTJ, and the second conductive pattern 320 that are included in each of the first memory cells MC1. The upper interlayer dielectric layer 350 may cover the bi-directional switching pattern SW and the third conductive pattern 330 that are included in each of the first memory cells MC1. According to the present embodiment, except for their relative positional arrangement, the magnetic tunnel junction pattern MTJ, the bi-directional switching pattern SW, and the first, second, and third conductive patterns 310, 320, and 330 may be configured substantially the same as the magnetic tunnel junction pattern MTJ, the bi-directional switching pattern SW, and the first, second, and third conductive patterns 310, 320, and 330 discussed with reference to FIGS. 3, 4, 5A, and 5B.

Figure 8:
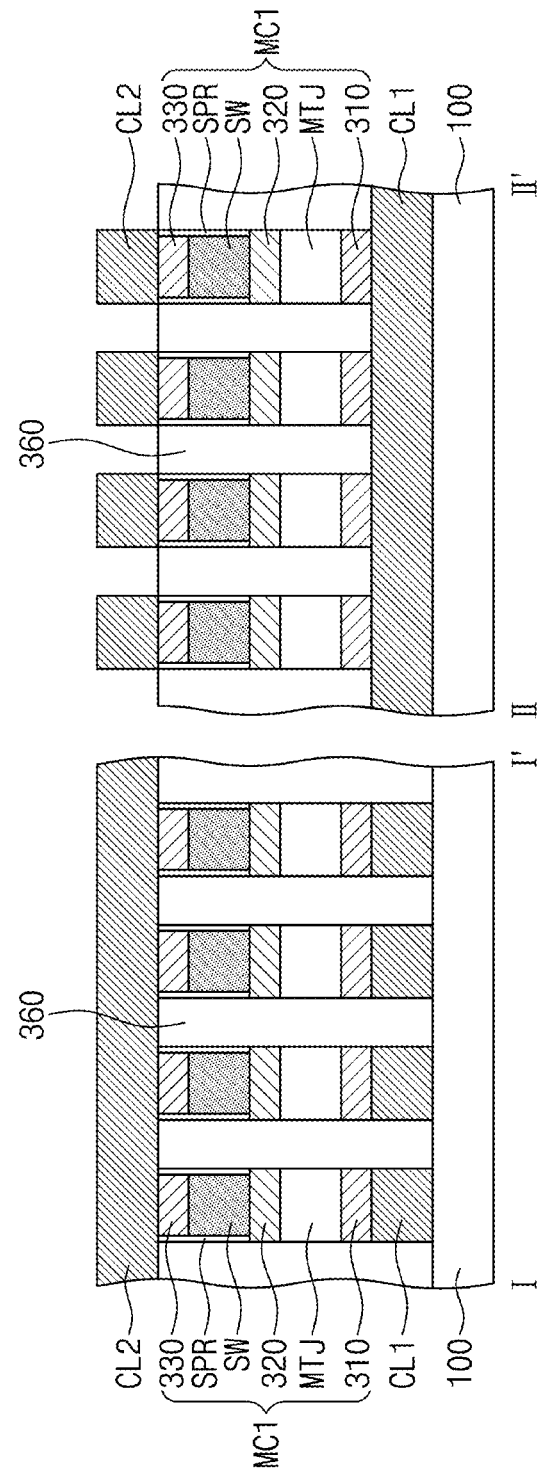
FIG. 8 illustrates a cross-sectional view taken along lines I-I' and II-II' of FIG. 3, showing a memory cell array of a semiconductor device according to exemplary embodiments of the present inventive concepts.

FIG. 8 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 8, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the magnetic tunnel junction pattern MTJ may be provided between the bi-directional switching pattern SW and the corresponding first conductive line CL1, and the bi-directional switching pattern SW may be provided between the magnetic tunnel junction pattern MTJ and the corresponding second conductive line CL2. Each of the first memory cells MC1 may include the first conductive pattern 310 between the corresponding first conductive line CL1 and the magnetic tunnel junction pattern MTJ, the second conductive pattern 320 between the magnetic tunnel junction pattern MTJ and the bi-directional switching pattern SW, and the third conductive pattern 330 between the corresponding second conductive line CL2 and the bi-directional switching pattern SW. Except for their relative positional arrangement, the magnetic tunnel junction pattern MTJ, the bi-directional switching pattern SW, and the first, second, and third conductive patterns 310, 320, and 330 may be configured substantially the same as the magnetic tunnel junction pattern MTJ, the bi-directional switching pattern SW, and the first, second, and third conductive patterns 310, 320, and 330 discussed with reference to FIGS. 3, 4, 5A, and 5B. According to the present embodiment, each of the first memory cells MC1 may include spacer patterns SPR on sidewalls of the bi-directional switching pattern SW. The spacer patterns SPR may include an insulating material. The substrate 100 may be provided thereon with an interlayer dielectric layer 360. The interlayer dielectric layer 360 may cover the first conductive lines CL1 and the first memory cells MC1. The second conductive lines CL2 may be provided on the interlayer dielectric layer 360.

The bi-directional switching pattern SW may be formed by forming a switching layer on the substrate 100 and then patterning the switching layer. After the switching layer is patterned, the spacer patterns SPR may be formed to cover the sidewalls of the bi-directional switching pattern SW. The spacer patterns SPR may serve to prevent deterioration of the bi-directional switching pattern SW during a subsequent patterning process (e.g., a patterning process for forming the magnetic tunnel junction pattern MTJ).

When a manufacturing process for a semiconductor device including the magnetic tunnel junction pattern MTJ is performed at a relatively high temperature, constituent elements of the magnetic tunnel junction pattern MTJ may diffuse into neighboring layers (or patterns), and thus the magnetic tunnel junction pattern MTJ may deteriorate in characteristics. Accordingly, it may be required that the manufacturing process for a semiconductor device including the magnetic tunnel junction pattern MTJ be performed at a relatively low temperature.

The bi-directional switching pattern SW may have a phase change transition temperature between a crystalline state and an amorphous state. The phase change temperature may fall within a range from about 350° C. to about 450° C. The bi-directional switching pattern SW may maintain its substantially amorphous state during the time when the manufacturing process for a semiconductor device is performed at a relatively lower temperature than the phase change transition temperature, thereby having bi-directional switching characteristics.

Figure 9:
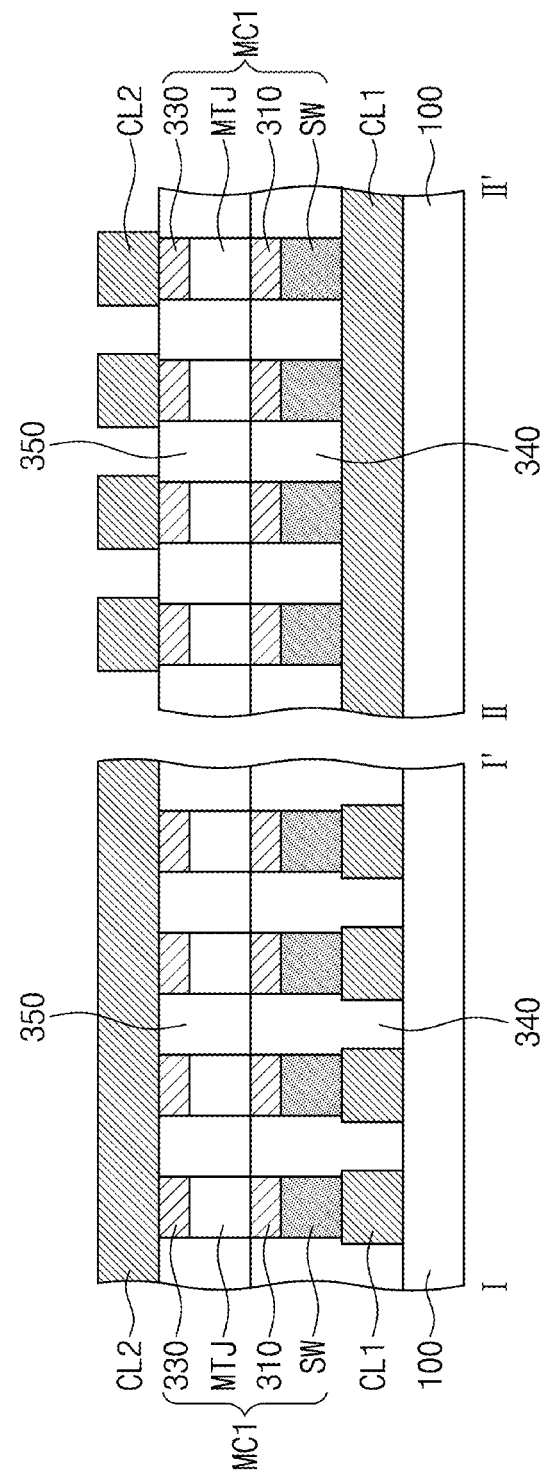
FIG. 9 illustrates a cross-sectional view taken along lines I-I' and II-II' of FIG. 3, showing a memory cell array of a semiconductor device according to exemplary embodiments of the present inventive concepts.

FIG. 9 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 9, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the bi-directional switching pattern SW may be in direct contact with the corresponding first conductive line CL1. Each of the first memory cells MC1 may include the first conductive pattern 310 between the bi-directional switching pattern SW and the magnetic tunnel junction pattern MTJ, and the third conductive pattern 330 between the magnetic tunnel junction pattern MTJ and the corresponding second conductive line CL2. The first conductive pattern 310 may prevent direct contact between the magnetic tunnel junction pattern MTJ and the bi-directional switching pattern SW and may electrically connect the magnetic tunnel junction pattern MTJ and the bi-directional switching pattern SW to each other. The substrate 100 may be provided thereon with the lower interlayer dielectric layer 340, which covers the first conductive lines CL1 and further covers the bi-directional switching pattern SW and the first conductive pattern 310 that are included in each of the first memory cells MC1, The lower interlayer dielectric layer 340 may be provided thereon with the upper interlayer dielectric layer 350, which covers the magnetic tunnel junction pattern MTJ and the third conductive pattern 330 that are included in each of the first memory cells MC1.

Figure 10:
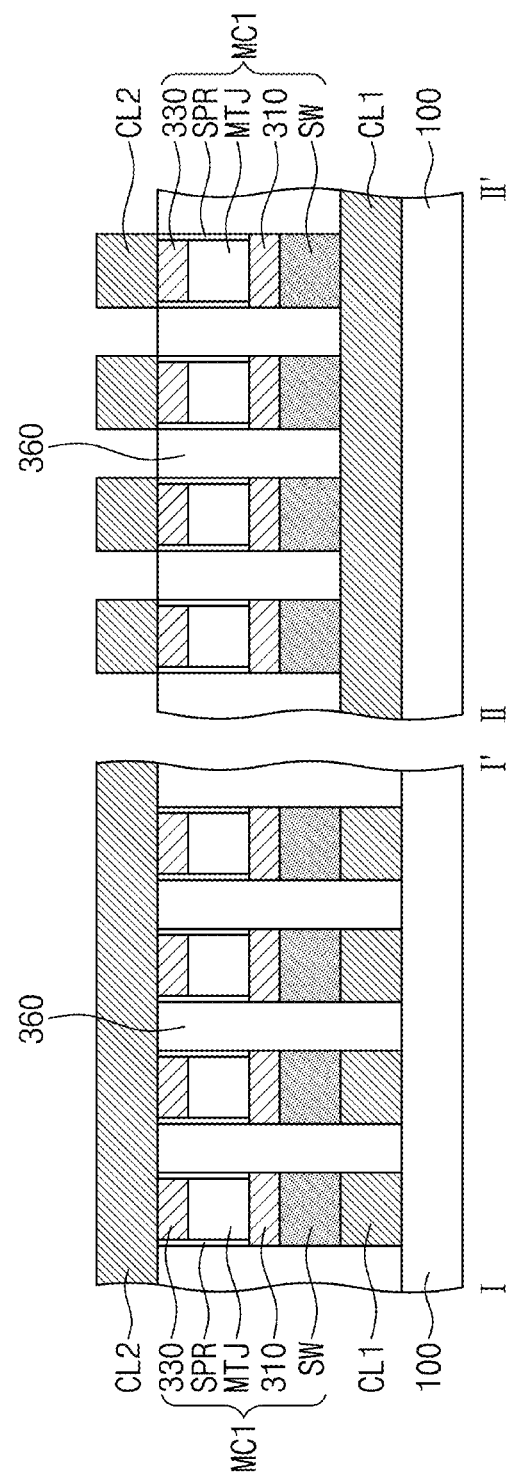
FIG. 10 illustrates a cross-sectional view taken along lines I-I' and II-II' of FIG. 3, showing a memory cell array of a semiconductor device according to exemplary embodiments of the present inventive concepts.

FIG. 10 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 10, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the bi-directional switching pattern SW may be in direct contact with the corresponding first conductive line CL1. Each of the first memory cells MC1 may include the first conductive pattern 310 between the bi-directional switching pattern SW and the magnetic tunnel junction pattern MTJ, and the third conductive pattern 330 between the magnetic tunnel junction pattern MTJ and the corresponding second conductive line CL2. The first conductive pattern 310 may prevent direct contact between the magnetic tunnel junction pattern MTJ and the bi-directional switching pattern SW and may electrically connect the magnetic tunnel junction pattern MTJ and the bi-directional switching pattern SW to each other, Each of the first memory cells MC1 may include spacer patterns SPR on sidewalls of the magnetic tunnel junction pattern MTJ. The spacer patterns SPR may include an insulating material. The spacer patterns SPR may also be on sidewalls of the third conductive pattern 330. The substrate 100 may be provided thereon with an interlayer dielectric layer 360. The interlayer dielectric layer 360 may cover the first conductive lines CL1 and the first memory cells MC1. The second conductive lines CL2 may be provided on the interlayer dielectric layer 360.

Figure 11:
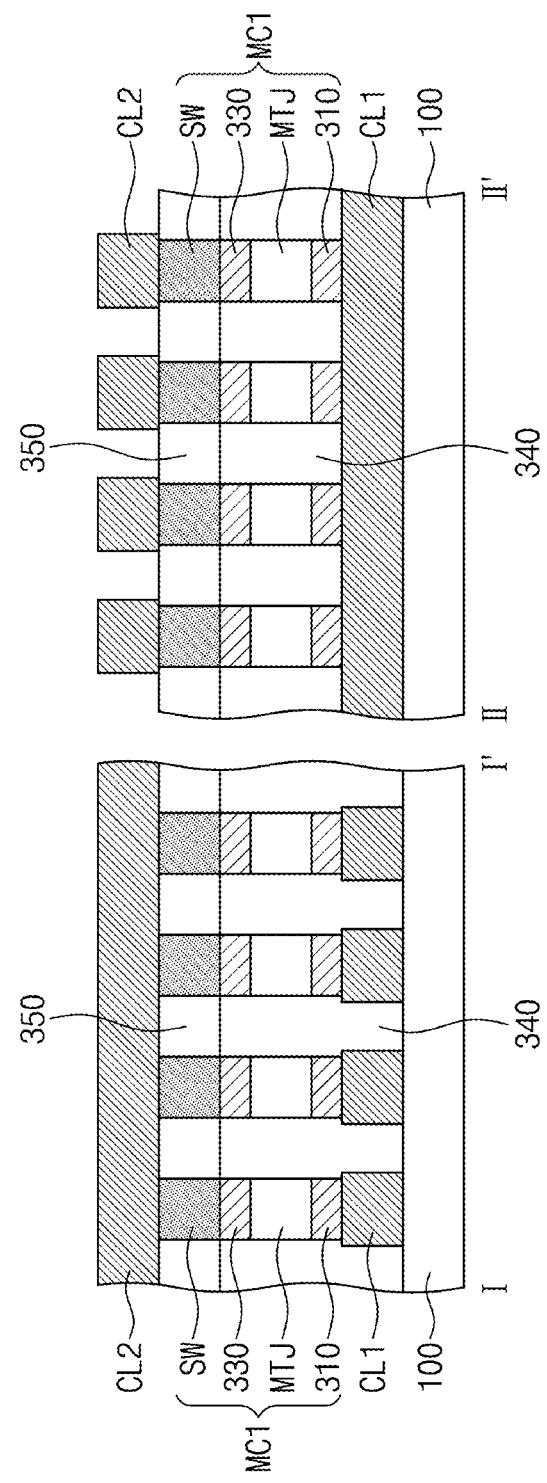
FIG. 11 illustrates a cross-sectional view taken along lines I-I' and II-II' of FIG. 3, showing a memory cell array of a semiconductor device according to exemplary embodiments of the present inventive concepts.

FIG. 11 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 11, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the bi-directional switching pattern SW may be in direct contact with the corresponding second conductive line CL2, and the magnetic tunnel junction pattern MTJ may be provided between the corresponding first conductive line CL1 and the bi-directional switching pattern SW. Each of the first memory cells MC1 may include the first conductive pattern 310 between the corresponding first conductive line CL1 and the magnetic tunnel junction pattern MTJ, and the third conductive pattern 330 between the magnetic tunnel junction pattern MTJ and the bi-directional switching pattern SW. The third conductive pattern 330 may prevent direct contact between the magnetic tunnel junction pattern MTJ and the bi-directional switching pattern SW and may electrically connect the magnetic tunnel junction pattern MTJ and the bi-directional switching pattern SW to each other. The substrate 100 may be provided thereon with the lower interlayer dielectric layer 340, which covers the first conductive lines CL1 and further covers the first conductive pattern 310, the magnetic tunnel junction pattern MTJ, and the third conductive pattern 330 that are included in each of the first memory cells MC1. The lower interlayer dielectric layer 340 may be provided thereon with the upper interlayer dielectric layer 350, which covers the bi-directional switching pattern SW that is included in each of the first memory cells MC1.

Figure 12:
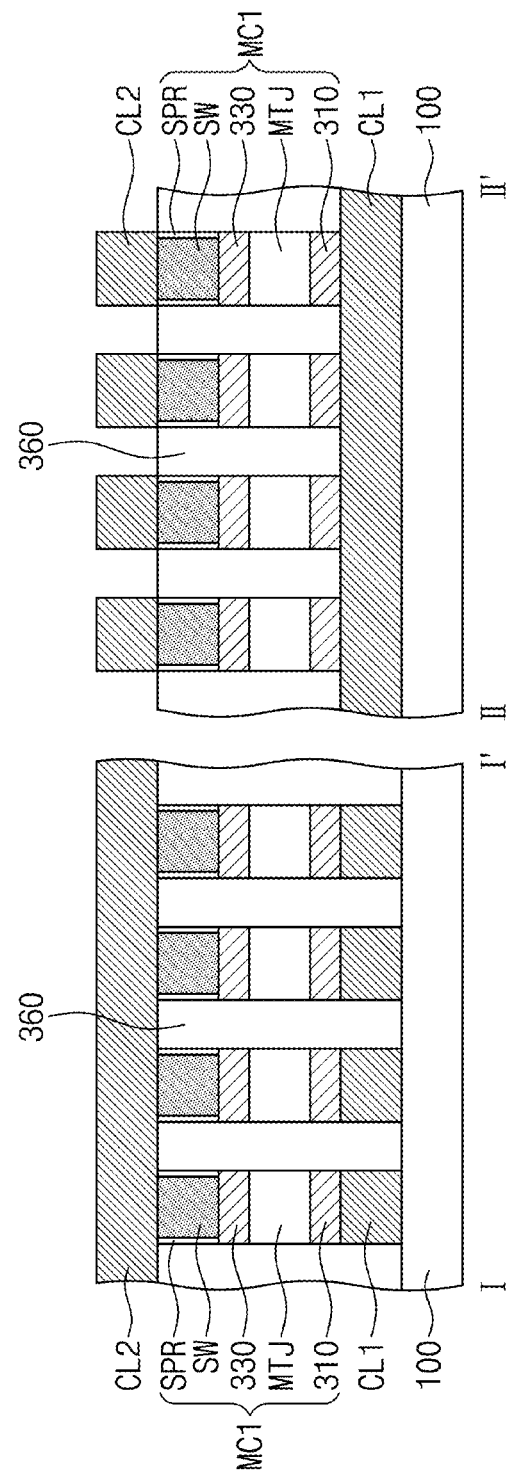
FIG. 12 illustrates a cross-sectional view taken along lines I-I' and II-II' of FIG. 3, showing a memory cell array of a semiconductor device according to exemplary embodiments of the present inventive concepts.

FIG. 12 illustrates a cross-sectional view taken along lines I-I' and II-II' of FIG. 3, showing a memory cell array of a semiconductor device according to exemplary embodiments of the present inventive concepts. Like reference numerals are used to refer to components the same as those of the semiconductor device discussed with reference to FIGS. 3, 4, 5A, and 5B, and a difference is chiefly explained for brevity of description.

Referring to FIGS. 3 and 12, each of the first memory cells MC1 may include the magnetic tunnel junction pattern MTJ and the bi-directional switching pattern SW that are coupled in series between the corresponding first conductive line CL1 and the corresponding second conductive line CL2. According to the present embodiment, the bi-directional switching pattern SW may be in direct contact with the corresponding second conductive line CL2, and the magnetic tunnel junction pattern MTJ may be provided between the corresponding first conductive line CL1 and the bi-directional switching pattern SW. Each of the first memory cells MC1 may include the first conductive pattern 310 between the corresponding first conductive line CL1 and the magnetic tunnel junction pattern MTJ, and the third conductive pattern 330 between the magnetic tunnel junction pattern MTJ and the bi-directional switching pattern SW. The third conductive pattern 330 may prevent direct contact between the magnetic tunnel junction pattern MTJ and the bi-directional switching pattern SW and may electrically connect the magnetic tunnel junction pattern MTJ and the bi-directional switching pattern SW to each other. Each of the first memory cells MC1 may include spacer patterns SPR on sidewalls of the bi-directional switching pattern SW. The spacer patterns SPR may include an insulating material. The substrate 100 may be provided thereon with an interlayer dielectric layer 360. The interlayer dielectric layer 360 may cover the first conductive lines CL1 and the first memory cells MC1. The second conductive lines CL2 may be provided on the interlayer dielectric layer 360.

Figure 13:
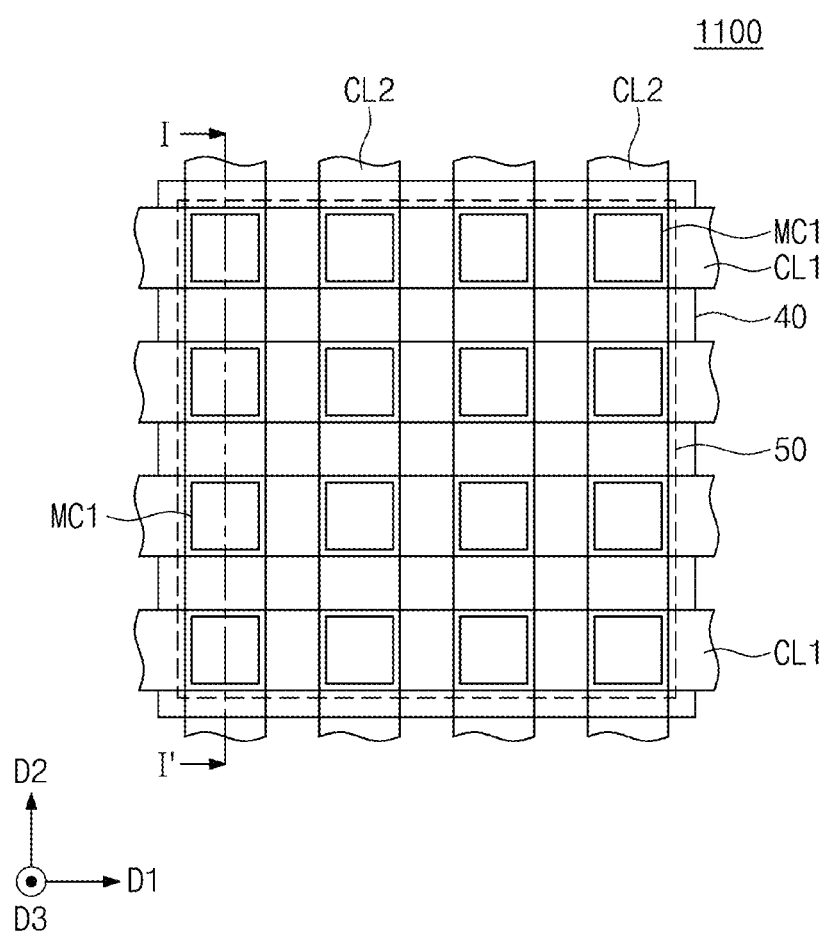
FIG. 13 illustrates a plan view showing a semiconductor device according to exemplary embodiments of the present inventive concepts.
Figure 14:
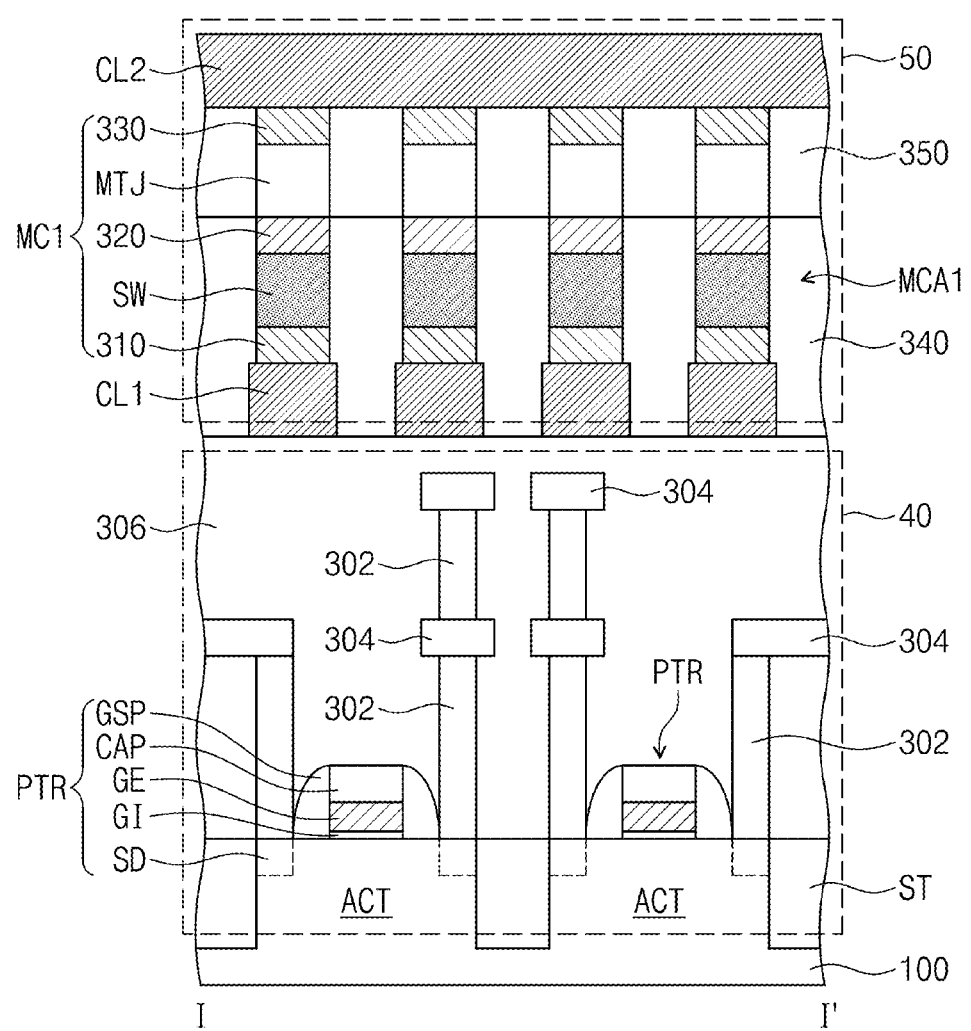
FIG. 14 illustrates a cross-sectional view taken along line I-I' of FIG. 13.

FIG. 13 illustrates a plan view showing a semiconductor device according to exemplary embodiments of the present inventive concepts. FIG. 14 illustrates a cross-sectional view taken along line I-I' of FIG. 13.

Referring to FIGS. 13 and 14, a semiconductor device 1100 may include a peripheral circuit section 40 on a substrate 100 and a memory section 50 on the peripheral circuit section 40. The peripheral circuit section 40 may be provided between the substrate 100 and the memory section 50. As viewed in plan, the memory section 50 may overlap the peripheral circuit section 40. The substrate 100 may be provided thereon with a device isolation layer ST defining an active region ACT. The device isolation layer ST may include, for example, a silicon oxide layer, a silicon nitride layer, or a silicon oxynitride layer.

The peripheral circuit section 40 may include the active region ACT and a peripheral transistor PTR on the active region ACT, The peripheral transistor PTR may include a gate electrode GE on the active region ACT, a gate dielectric pattern GI between the substrate 100 and the gate electrode GE, a gate capping pattern CAP on a top surface of the gate electrode GE, gate spacers GSP on sidewalls of the Rate electrode GE, and source/drain regions SD in the active region ACT on opposite sides of the gate electrode GE. The gate electrode GE may include a conductive material. The gate dielectric pattern GI, the gate capping pattern CAP, and the gate spacers GSP may include an oxide layer, a nitride layer, or an oxynitride layer. The source/drain regions SD may be impurity-doped regions provided in the substrate 100. The peripheral circuit section 40 may include a plurality of the peripheral transistors PTR.

The peripheral circuit section 40 may include a plurality of peripheral contacts 302 and a plurality of peripheral lines 304 that are connected, or electrically coupled, to the peripheral transistors PTR. The peripheral contacts 302 and the peripheral lines 304 may include a conductive material. The peripheral transistors PTR, the peripheral contacts 302, and the peripheral lines 304 may constitute a peripheral circuit that drives memory cells MC1 of the memory section 50. The peripheral circuit section 40 may include a lower insulating layer 306 that is provided on the substrate 100 and covers the peripheral transistors PTR. The peripheral contacts 302 and the peripheral lines 304 may penetrate at least a portion of the lower insulating layer 306 to come into connection, or electrical contact, with the peripheral transistors PTR. The lower insulating layer 306 may include a silicon oxide layer, a silicon nitride layer, or a silicon oxynitride layer.

The memory section 50 may be provided on the lower insulating layer 306. The memory section 50 may include the memory cell array discussed with reference to FIGS. 1 to 12. For example, the memory section 50 may include a plurality of first conductive lines CL1 on the lower insulating layer 306, and a plurality of second conductive lines CL2 crossing over the first conductive lines CL1. The memory section 50 may include a plurality of first memory cells MC1 that are correspondingly disposed at intersections between the first conductive lines CL1 and the second conductive lines CL2. For example, each of the first memory cells MC1 may include a magnetic tunnel junction pattern MTJ, a bi-directional switching pattern SW, and first, second, and third conductive patterns 310, 320, and 330, as discussed with reference to FIGS. 3, 4, 5A, and 5B. The memory section 50 may include lower and upper interlayer dielectric layers 340 and 350, as discussed with reference to FIGS. 3, 4, 5A, and 5B. The lower and upper interlayer dielectric layers 340 and 350 may be sequentially stacked on the lower insulating layer 306. Alternatively, differently from that shown, each of the first memory cells MC1 may include components corresponding to those of the first memory cells MC1 discussed with reference to FIGS. 6 to 12.

The first memory cells MC1 may constitute a first memory stack MCA1. Although only one memory cell stack MCA1 is illustrated for convenience of description, the memory section 50 may include a plurality of memory cell stacks that are stacked in a direction (e.g., a third direction D3) perpendicular to a top surface of the substrate 100. Accordingly, the substrate 100 may be provided thereon with repeatedly stacked structures corresponding to the first memory cell stack MCA1 and the first and second conductive lines CL1 and CL2. Although not shown, each of the first and second conductive lines CL1 and CL2 may be connected to a corresponding one of the peripheral transistors PTR through a corresponding one of the peripheral contacts 302 and a corresponding one of the peripheral lines 304.

Figure 15:
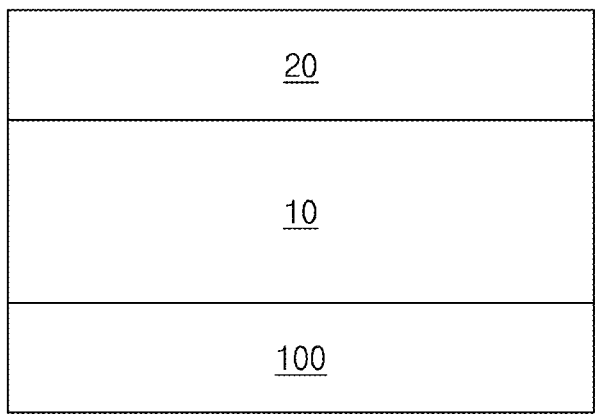
FIG. 15 illustrates a simplified cross-sectional view showing an arrangement inside a semiconductor device according to exemplary embodiments of the present inventive concepts.

FIG. 15 illustrates a simplified cross-sectional view showing an arrangement inside a semiconductor device according to exemplary embodiments of the present inventive concepts.

Referring to FIG. 15, a semiconductor device 1000 includes a first memory section 10 and a second memory section 20 on a substrate 100. The first memory section 10 is between the substrate 100 and the second memory section 20. The first memory section 10 and the second memory sections 20 are sequentially stacked on the substrate 100 in a direction perpendicular to a top surface of the substrate 100. For example, the first memory section 10 and the second memory section 20 are vertically stacked on the top surface of the substrate 100. The first memory section 10 may include a flash memory cell structure, and the second memory section 20 may include a variable resistance memory cell structure. For example, the first memory section 10 may serve as a main memory, and the second memory section 20 may serve as a buffer memory.

Figure 16:
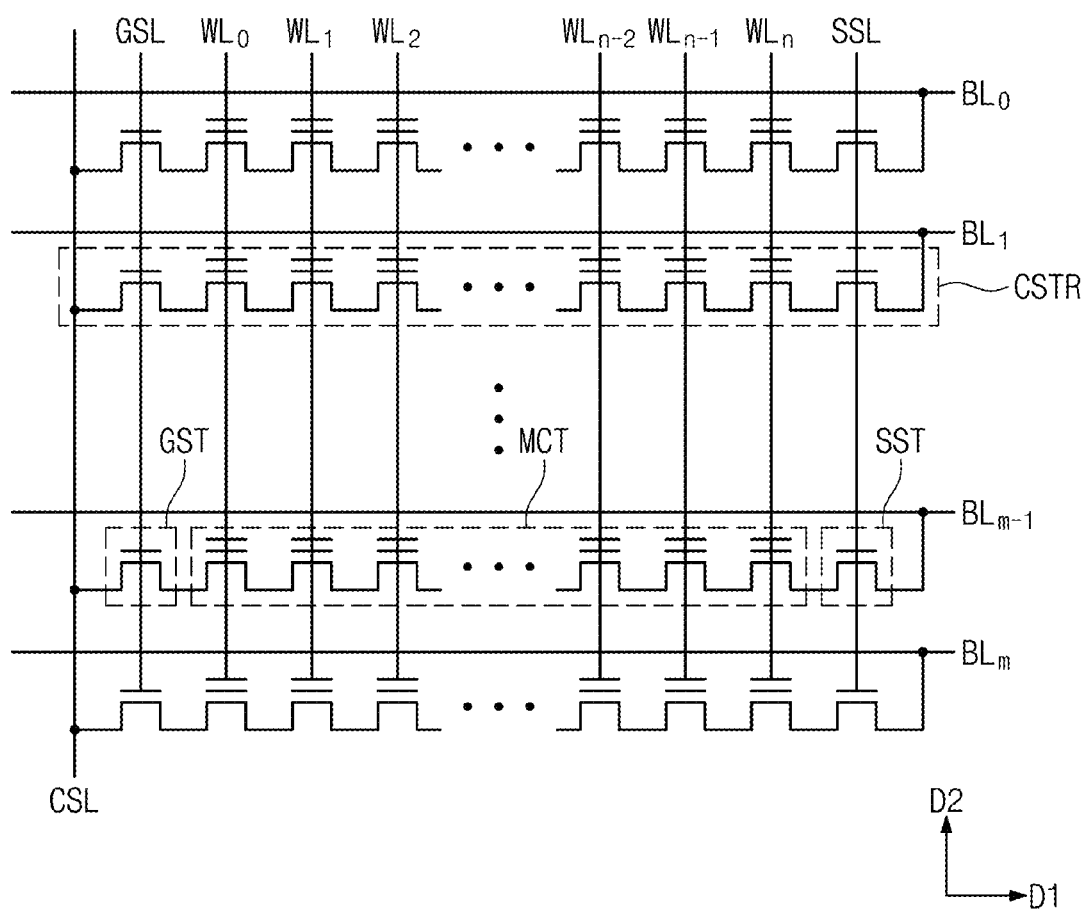
FIGS. 16 to 18 illustrate circuit diagrams showing a memory cell array on a first memory section of FIG. 15.
Figure 17:
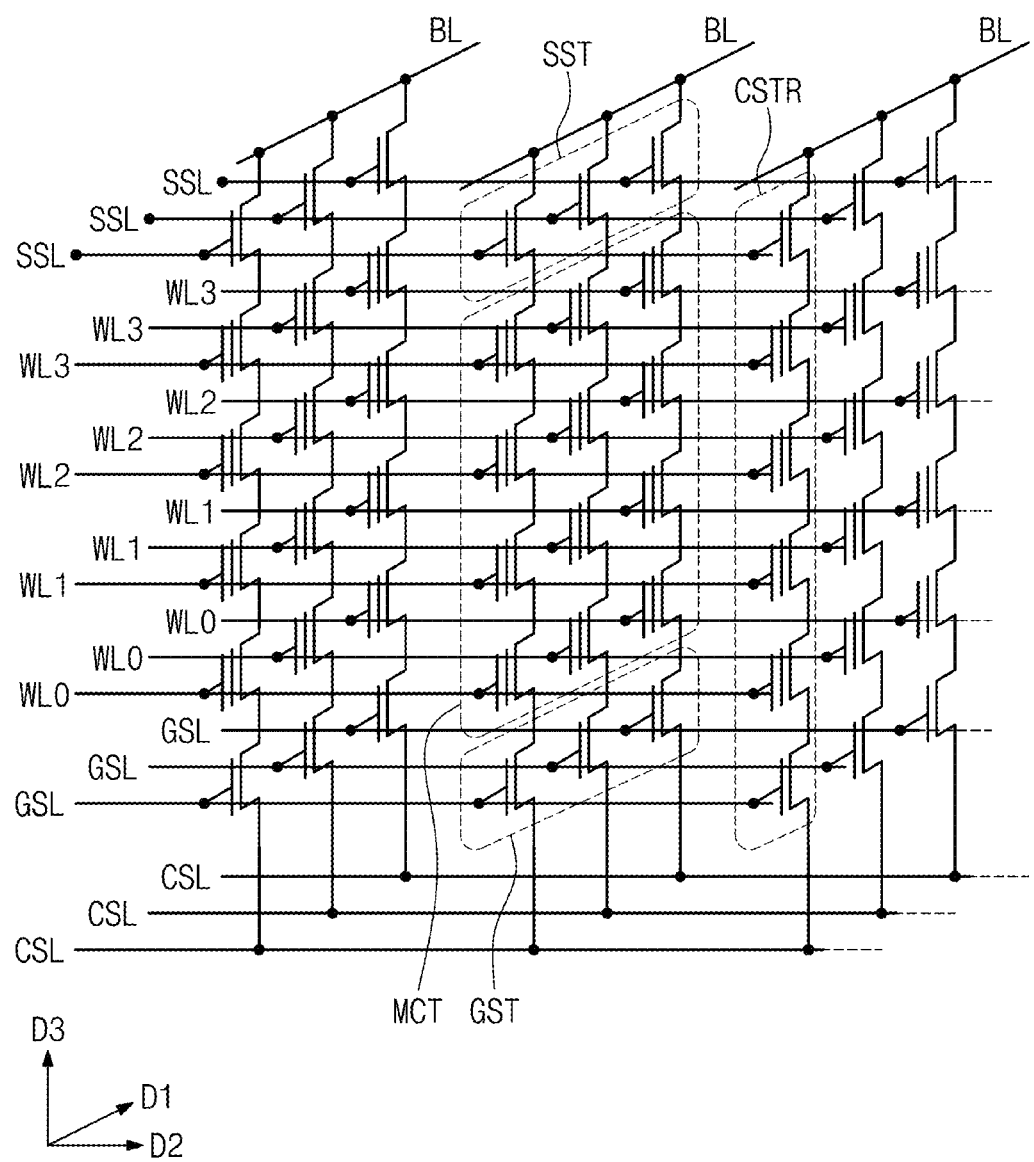
Figure 18:
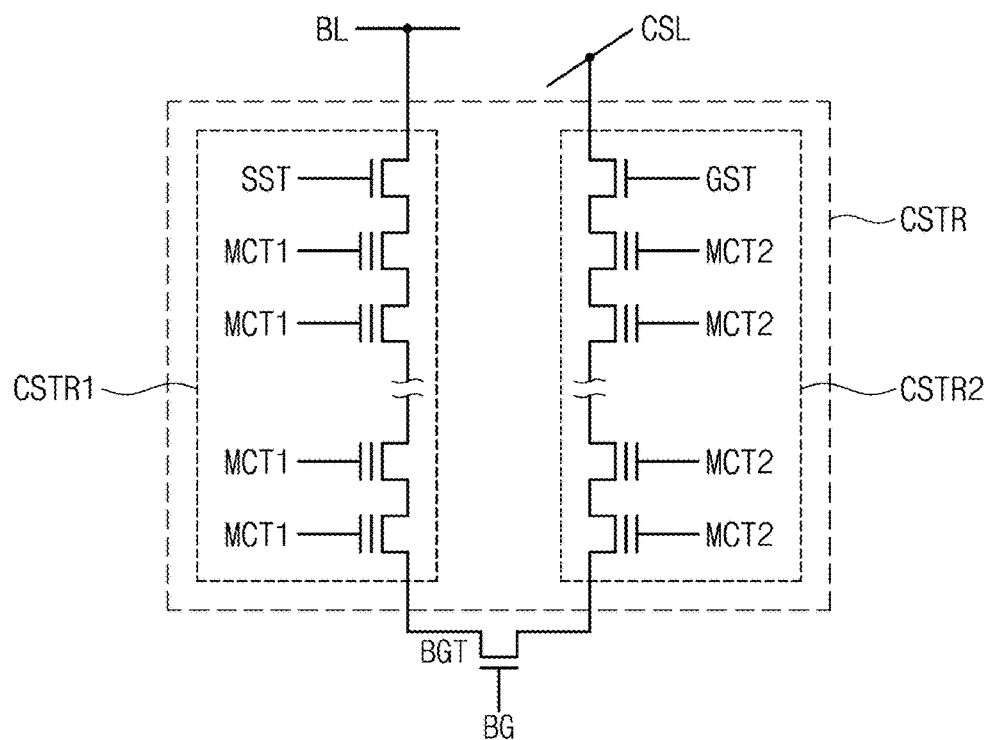

FIGS. 16 to 18 illustrate circuit diagrams showing a memory cell array on the first memory section of FIG. 15;

Referring to FIG. 16, in some embodiments, the first memory section 10 includes a three-dimensional NAND flash memory cell array. For example, the first memory section 10 includes a plurality of cell strings CSTR. Each of the plurality of cell strings CSTR includes a string select transistor SST connected to a string select line SSL, a plurality of memory cell transistors MCT correspondingly connected to a plurality of word lines WL0 to WLn (where n is a natural number), and a ground select transistor GST connected to a ground select line GSL. The string select transistor SST is connected to one of a plurality of bit lines BL0 to BLm (where m is a natural number), and the ground select transistor GST is connected to a common source line CSL. The bit lines BL0 to BLm extend in a first direction D1. The string select line SSL, the word lines WL0 to WLn, and the ground select line GSL extend in a second direction D2 crossing the first direction D1. The first and second directions D1 and D2 may be parallel to the top surface of the substrate 100 of FIG. 15.

The substrate 100 of FIG. 15 is provided thereon with the string select line SSL, the word lines WL0 to WLn, and the ground select line GSL. The string select line SSL, the word lines WL0 to WLn, and the ground select line GSL may be used as gate electrodes of the string select transistor SST, the memory cell transistors MCT, and the ground select transistor GST, respectively. Each of the memory cell transistors MCT may include a data storage element.

Referring to FIG. 17, in some embodiments, the first memory section 10 includes a three-dimensional NAND flash memory cell array. For example, the first memory section 10 includes a common source line CSL, a plurality of hit lines BL, and a plurality of cell strings CSTR between the common source line CLS and the bit lines BL.

The common source line CSL may be a conductive thin layer disposed on the substrate 100 of FIG. 15 or an impurity region formed in the substrate 100 of FIG. 15. The bit lines BL may be conductive patterns (e.g., metal lines) disposed on the substrate 100 of FIG. 15 that are spaced apart from the substrate 100 in a third direction D3 perpendicular to the top surface of the substrate 100. The third direction D3 may be referred to as a "vertical direction" or "vertically." The bit lines BL may extend in the first direction D1 and be spaced apart from each other in the second direction D2. The cell strings CSTR are connected in parallel to one of the bit lines BL. The cell strings CSTR are connected in common to the common source line CSL. In some embodiments, the common source line CSL may be provided in plural, which may be two-dimensionally arranged on the substrate 100. The common source line CSL in plural may be supplied with the same voltage or electrically controlled independently of each other.

Each of the cell strings CSTR includes a ground select transistor GST connected to the common source line CSL, a string select transistor SST connected to the bit line BL, and a plurality of memory cell transistors MCT between the ground and string select transistors GST and SST. The ground select transistor GST, the string select transistor SST, and the memory cell transistors MCT may be connected in series to each other.

The common source line CSL may be connected in common to sources of the ground select transistors GST. The common source line CLS and the bit lines BL may be provided therebetween with a ground select line GSL, a plurality of word lines WL1 to WL3, and the string select line SSL, which may serve as gate electrodes of the ground select transistor GST, the memory cell transistors MCT, and the string select transistor SST, respectively. The ground select line GSL, the plurality of word lines WL0 to WL3, and the string select line SSL may be sequentially stacked along the third direction D3 on the top surface of the substrate 100. Each of the memory cell transistors MCT may include a data storage element.

Referring to FIG. 18, in some embodiments, the first memory section 10 includes a three-dimensional NAND flash memory cell array. For example, the first memory section 10 includes a common source line CSL, a bit line BL, and a cell string CSTR between the common source line CLS and the bit line BL. The common source line CSL may be a conductive thin layer (or a conductive pattern) disposed on the substrate 100 of FIG. 15, and the bit line BL may be a conductive pattern (e.g., a metal line) disposed on the substrate 100 of FIG. 15. The common source line CSL and the bit line BL may be spaced apart from the substrate 100 in a direction perpendicular to the top surface of the substrate 100 of FIG. 15.

The cell string CSTR is between the common source line CSL and the substrate 100 of FIG. 15 and between the bit line BL and the substrate 100 of FIG. 15. The cell string CSTR includes an upper string CSTR1 connected to the bit line BL and a lower string CSTR2 connected to the common source line CSL. The upper string CSTR1 is connected to the lower string CSTR2 through a back gate transistor BGT. The back gate transistor BGT is controlled by a back gate line BG provided on the substrate 100 of FIG. 15. The upper string CSTR1 includes a string select transistor SST connected to the bit line BL and a plurality of upper memory cell transistors MCT1 between the string select transistor SST and the back gate transistor BGT. The string select transistor SST and the upper memory cell transistors MCT1 are connected in series to each other. The lower string CSTR2 includes a ground select transistor GST connected to the common source line CSL and a plurality of lower memory cell transistors MCT2 between the ground select transistor GST and the back gate transistor BGT. The ground select transistor GST and the lower memory cell transistors MCT2 are connected in series to each other. Each of the upper and lower memory cell transistors MCT1 and MCT2 may include a data storage element.

Figure 19:
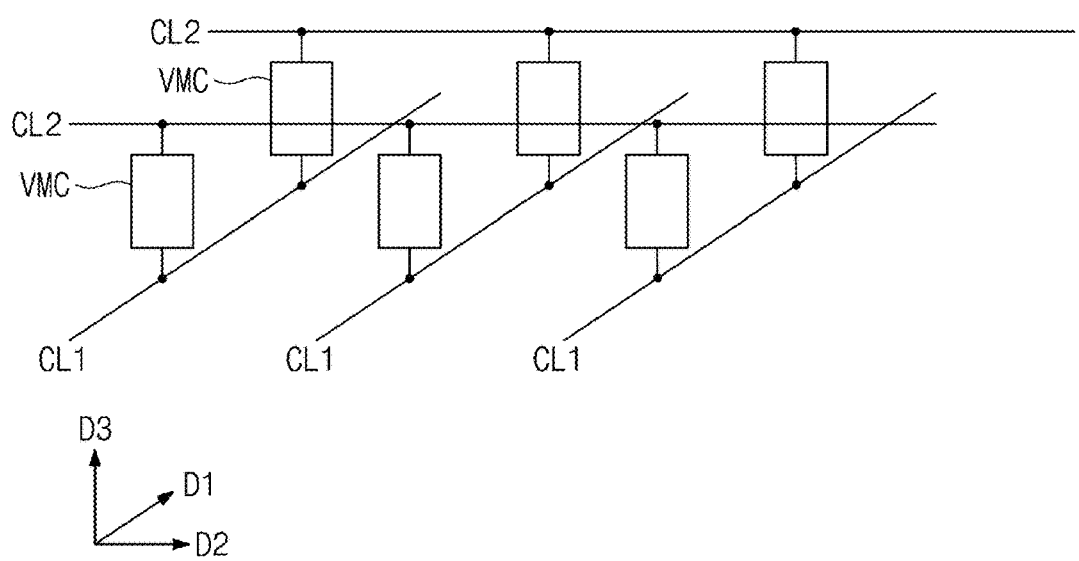
FIG. 19 illustrates a circuit diagram showing a memory cell array on a second memory section of FIG. 15.
Figure 20:
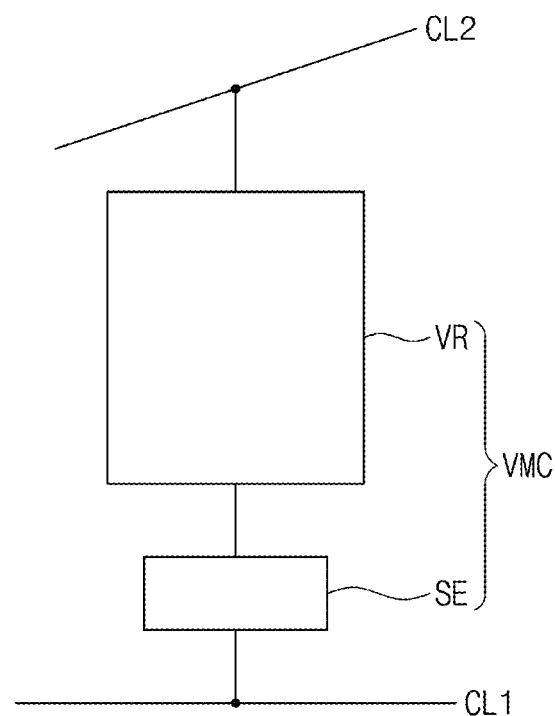
FIG. 20 illustrates a circuit diagram showing a unit memory cell on a second memory section of FIG. 15.

FIG. 19 illustrates a circuit diagram showing a memory cell array on the second memory section of FIG. 15, and FIG. 20 illustrates a circuit diagram showing a unit memory cell on the second memory section of FIG. 15.

Referring to FIG. 19, the second memory section 20 includes a variable resistance memory cell array. The variable resistance memory cell array may include a magnetoresistive random access memory (MRAM) cell array, a phase change random access memory (PRAM) cell array, or a resistive random access memory (RRAM) cell array. For example, the second memory section 20 includes a plurality of first conductive lines CL1, a plurality of second conductive lines CL2 crossing the first conductive lines CL1, and a plurality of variable resistance memory cells VMC at intersections between the first and second conductive lines CL1 and CL2 in a plan view. The substrate 100 of FIG. 15 is provided thereon with the first conductive lines CL1, which extend in the first direction D1 and are spaced apart from each other in the second direction D2. The first conductive lines CL1 are provided thereon with the second conductive lines CL2, which extend in the second direction D2 and are spaced apart from each other in the first direction D1. The second conductive lines CL2 may be positioned higher from the substrate 100 of FIG. 15 than the first conductive lines CL1. Each of the variable resistance memory cells VMC may be positioned at an intersection between one of the first conductive lines CL1 and one of the second conductive lines CL2 in a plan view, and may be connected to the one of the first and second conductive lines CL1 and CL2.

The first conductive lines CL1 may correspond to the bit lines BL0 to BLm and BL discussed with reference to FIGS. 16 to 18. For example, the first conductive lines CL1 may be the bit lines BL0 to BLm discussed with reference to FIG. 16. In this case, the variable resistance memory cells VMC may be correspondingly provided at intersections between the second conductive lines CL2 and the bit lines BL0 to BLm in a plan view, and each of the variable resistance memory cells VMC may be connected to one of the bit lines BL0 to BLm and one of the second conductive lines CL2. Alternatively, the first conductive lines CL1 may be the bit lines BL discussed with reference to FIG. 17. In this case, the variable resistance memory cells VMC may be correspondingly provided at intersections between the second conductive lines CL2 and the bit lines BL in a plan view, and each of the variable resistance memory cells VMC may be connected to one of the bit lines BL and one of the second conductive lines CL2. Alternatively, one of the first conductive lines CL1 may be the bit line BL discussed with reference to FIG. 18. In this case, the variable resistance memory cells VMC may be correspondingly provided at intersections between the second conductive lines CL2 and a plurality of the bit lines BL in a plan view, and each of the variable resistance memory cells VMC may be connected to one of the plurality of the bit lines BL and one of the second conductive lines CL2. As such, the first memory section 10 and the second memory section 20 may share the bit lines BL0 to BLm and BL.

Referring to FIG. 20, each of the variable resistance memory cells VMC may include a variable resistance element VR and a select element SE. The variable resistance element VR and the select element SW are connected in series to each other between one of the first conductive lines CL1 and one of the second conductive lines CL2. For example, the variable resistance element VR is connected between the select element SE and the one of the second conductive lines CL2, and the select element SE is connected between the variable resistance element VR and the one of the first conductive lines CL1, but the present inventive concept are not limited thereto. For example, unlike that illustrated in FIG. 20, the variable resistance element VR may be connected between the select element SE and the one of the first conductive lines CL1, and the select element SE may be connected between the variable resistance element VR and the one of the second conductive lines CL2.

The variable resistance element VR may include a data storage element. The variable resistance element VR may be switched between two resistance states when being supplied with an electrical pulse. The variable resistance element VR may be formed to have a thin-film structure of which electrical resistance is changed by a spin transferring phenomenon of an electrical current passing through the variable resistance element VR. The variable resistance element VR may include a thin-film structure configured to exhibit a magneto-resistance property and may include at least one ferromagnetic material or at least one anti-ferromagnetic material.

The select element SE may be configured to selectively control a charge flow passing across the variable resistance element VR. For example, the select element SE may be configured to exhibit a non-linear I-V curve or rectifying characteristics, and thus the electric current passing through each of the variable resistance memory cells VMC may be controlled to have a unidirectional property. Alternatively, the select element SE may include a non-linear resistor exhibiting a resistance property that varies depending on an applied voltage. For example, when resistance of the resistor is inversely proportional to an applied voltage, a selected cell under a high voltage difference may be in a lower resistance state allowing an electric current passing through the selected cell, while a non-selected cell under a low voltage difference may be in a high resistance state preventing electric current from passing through the non-selected cell. For example, the select element SE may be a device based on a threshold switching exhibiting a non-linear I-V curve (e.g., S-type I-V curve). The select element SE may be an OTS (Ovonic Threshold Switch) device exhibiting bidirectional characteristics.

Referring back to FIG. 19, although not shown, the second memory section 20 may include a plurality of third conductive lines, which are disposed on the second conductive lines CL2, and additional variable resistance memory cells VMC, which are correspondingly provided at intersections between the second conductive lines CL2 and the third conductive lines in a plan view. In this case, the second memory section 20 may have a cross-point cell array structure in which the variable resistance memory cells VMC are three-dimensionally arranged along the first to third directions D1 to D3.

Figure 21A:
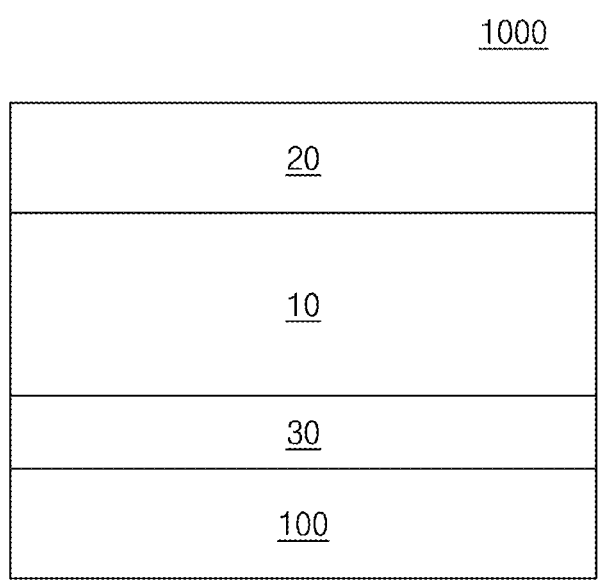
FIG. 21A illustrates a simplified cross-sectional view showing an arrangement inside a semiconductor device according to exemplary embodiments of the present inventive concepts.
Figure 21B:
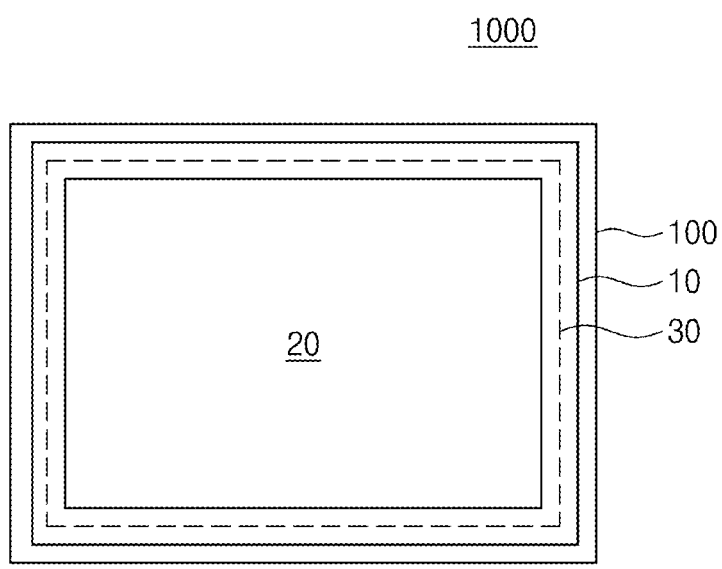
FIG. 21B illustrates a simplified plan view showing an arrangement inside the semiconductor device of FIG. 21A.

FIG. 21A illustrates a simplified cross-sectional view showing an arrangement inside a semiconductor device according to exemplary embodiments of the present inventive concepts. FIG. 21B illustrates a simplified plan view showing an arrangement inside the semiconductor device of FIG. 21A.

Referring to FIGS. 21A and 21B, the semiconductor device 1000 includes a first memory section 10 and a second memory section 20, and further includes a peripheral circuit section 30 between a substrate 100 and the first memory section 10. The peripheral circuit section 30, the first memory section 10, and the second memory section 20 are sequentially stacked on a top surface of the substrate 100 along a direction perpendicular to the top surface of the substrate 100.

The first memory section 10 may include a plurality of flash memory cells that are two- or three-dimensionally arranged on the substrate 100. The flash memory cells may correspond to the memory cell transistors MCT, MCT1, and MCT2 discussed with reference to FIGS. 16 to 18. The second memory section 20 may include a plurality of variable resistance memory cells that are two- or three-dimensionally arranged on the substrate 100. The variable resistance memory cells may correspond to the variable resistance memory cells VMC discussed with reference to FIG. 19. For example, the variable resistance memory cells may each include the variable resistance element VR and the select element SE.

The peripheral circuit section 30 may include memory circuit functional blocks that operate the flash memory cells of the first memory section 10. For example, the peripheral circuit section 30 may include a row decoder, a page buffer, an I/O buffer, a control logic, a buffer RAM, etc. The buffer RAM may include a volatile memory device such as a dynamic-random-access memory (DRAM) device or a static-random-access memory (SRAM) device. The peripheral circuit section 30 may further include an additional memory circuit functional block that serve to operate the variable resistance memory cells of the second memory section 20.

Figure 22A:
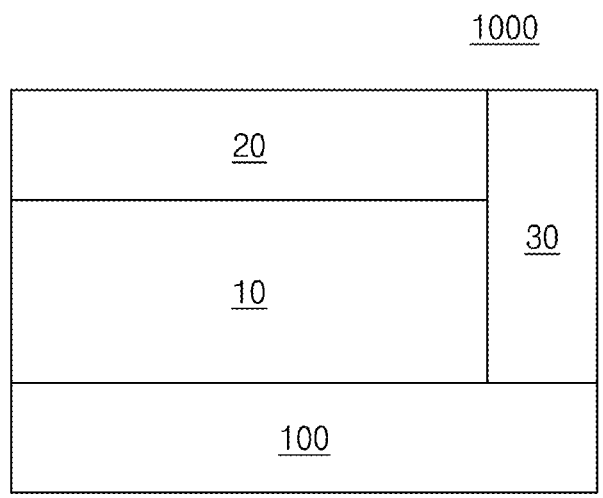
FIG. 22A illustrates a simplified cross-sectional view showing an arrangement inside a semiconductor device according to exemplary embodiments of the present inventive concepts.
Figure 22B:
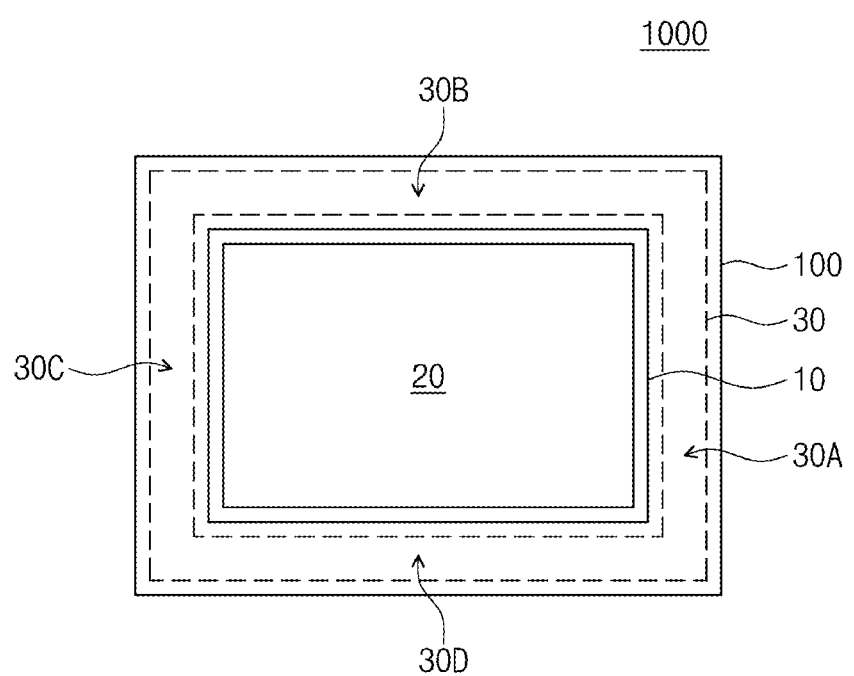
FIG. 22B illustrates a simplified plan view showing an arrangement inside the semiconductor device of FIG. 22A.

FIG. 22A illustrates a simplified cross-sectional view showing an arrangement inside a semiconductor device according to exemplary embodiments of the present inventive concepts. FIG. 22B illustrates a simplified plan view showing an arrangement inside the semiconductor device of FIG. 22A. The following semiconductor device is similar to that discussed with reference to FIGS. 21A and 21B, and thus the major differences between the semiconductor devices will be described below in the interest of brevity of description.

Referring to FIGS. 22A and 22B, the semiconductor device 1000 includes a first memory section 10, a second memory section 20, and a peripheral circuit section 30 on at least one side of the first memory section 10. The first memory section 10 and the peripheral circuit section 30 are disposed side by side on the substrate 100. The peripheral circuit section 30 is disposed adjacent to only one side of the first memory section 10 (30A), adjacent to two sides of the first memory section 10 (30A and 30B), adjacent to three sides of the first memory section 10 (30A, 30B, and 30C), or surrounding four sides of the first memory section 10 (30A, 30B, 30C, and 30D). According to the present embodiments, except for its relative arrangement, the peripheral circuit section 30 may be configured substantially the same as the peripheral circuit section 30 discussed with reference to FIGS. 21A and 21B.

Figure 23:
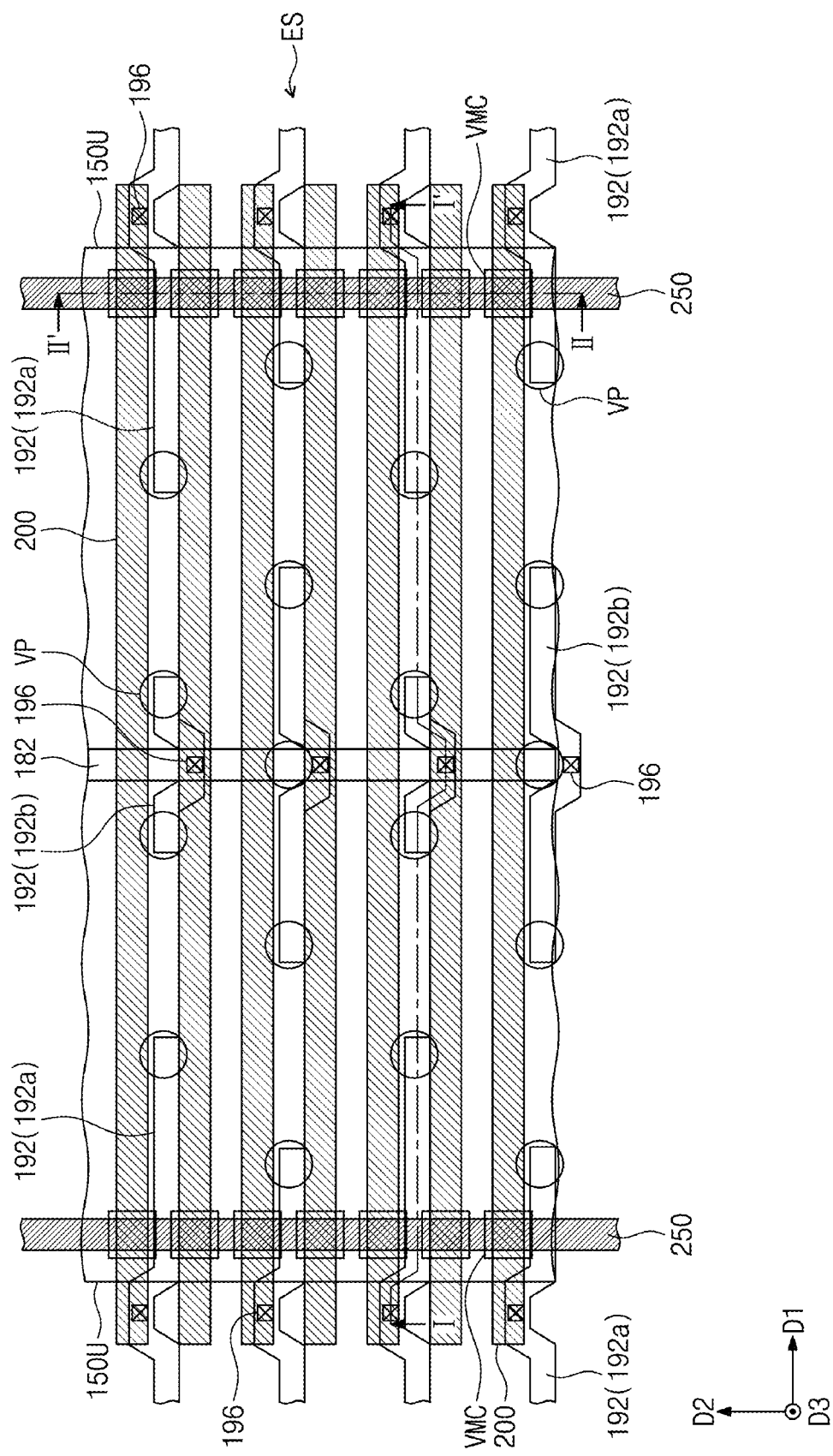
FIG. 23 illustrates a plan view showing a cell array of a semiconductor device according to exemplary embodiments of the present inventive concepts.
Figure 24:
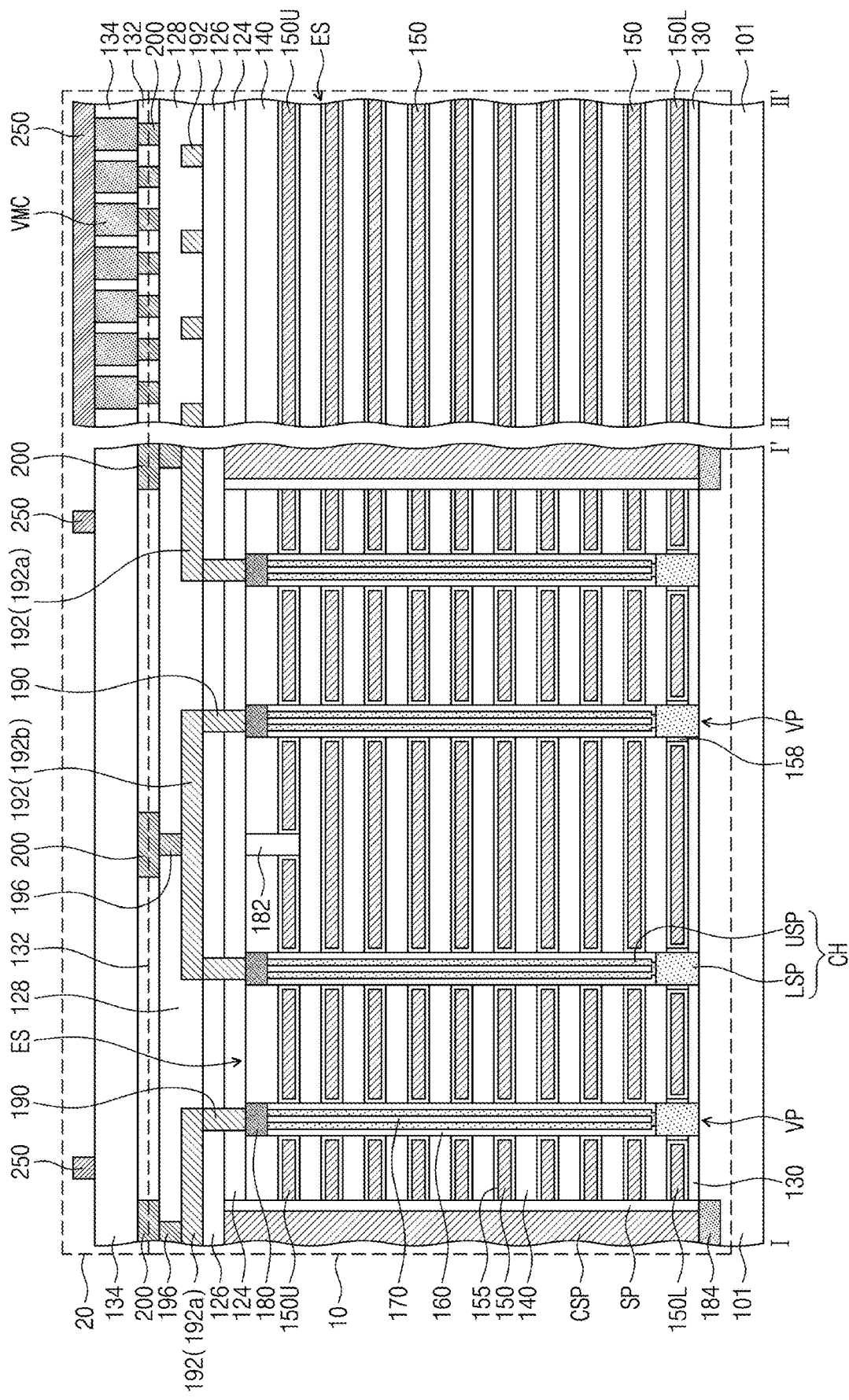
FIG. 24 illustrates a cross-sectional view taken along lines I-I' and of FIG. 23.

FIG. 23 illustrates a plan view showing a cell array of a semiconductor device according to exemplary embodiments of the present inventive concepts. FIG. 24 illustrates a cross-sectional view taken along lines I-I' and II-II' of FIG. 23.

Referring to FIGS. 23 and 24, a first memory section 10 and a second memory section 20 are vertically sacked on a lower structure 101. In some embodiments, the lower structure 101 may include the substrate 100 and the peripheral circuit section 30 discussed with reference to FIGS. 21A and 21B. In this case, the lower structure 101 may further include a semiconductor layer between the peripheral circuit section 30 and the first memory section 10, and the first memory section 10 and the second memory section 20 may be provided on the semiconductor layer. In other embodiments, the lower structure 101 may include the substrate 100 and the peripheral circuit section 30 discussed with reference to FIGS. 22A and 22B. In this case, the first memory section 10 and the second memory section 20 may be provided directly on the substrate 100.

The first memory section 10 may include a three-dimensional NAND flash memory cell structure provided on the lower structure 101. For example, an electrode structure ES is provided on the lower structure 101. The electrode structure ES includes a plurality of gate electrodes 150L, 150, and 150U sequentially stacked on the lower structure 101 and a plurality of insulating layers 140 between the gate electrodes 150L, 150, and 150U. The gate electrodes 150L, 150, and 150U and the insulating layers 140 are alternately and repeatedly stacked on the lower structure 101. The insulating layers 140 may electrically insulate the gate electrodes 150L, 150, and 150U from each other. A topmost gate electrode 150U of the gate electrodes 150L, 150, and 150U includes two uppermost gate electrodes that are horizontally spaced apart from each other. The two uppermost gate electrodes of the topmost gate electrode 150U are separated from each other by a separation insulating pattern 182 that extends in the second direction D2 therebetween. A buffer insulating layer 130 is interposed between the lower structure 101 and a lowermost gate electrode 150L of the gate electrodes 150L, 150, and 150U.

The insulating layers 140 may have substantially the same thickness, or at least one of the insulating layers 140 may be thicker than the others. The buffer insulating layer 130 may be thinner than the insulating layers 140. The insulating layers 140 may include a silicon oxide layer or a low-k dielectric layer, and the buffer insulating layer 130 may include an insulating material (e.g., a silicon oxide layer). The gate electrodes 150L, 150, and 150U may include metal or metal nitride. The separation insulating pattern 182 may include an insulating material (e.g., a silicon oxide layer).

The lower structure 101 is provided thereon with a plurality of vertical patterns VP penetrating the electrode structure ES. Each of the vertical patterns VP penetrates the electrode structure ES and is in contact with the lower structure 101. When the lower structure 101 includes the substrate 100 and the peripheral circuit section 30 discussed with reference to FIGS. 21A and 21B, each of the vertical patterns VP penetrates the electrode structure ES and is in contact with the semiconductor layer of the lower structure 101. When the lower structure 101 includes the substrate 100 and the peripheral circuit section 30 discussed with reference to FIGS. 22A and 22B, each of the vertical patterns VP penetrates the electrode structure ES and is in contact with the substrate 100. As viewed in plan, the vertical patterns VP are arranged in a zigzag manner along the second direction D2.

Each of the vertical patterns VP includes a channel structure CH that protrudes upward from the lower structure 101. The channel structure CH may include a plurality of channel structures. For example, the channel structure CR includes a lower semiconductor pattern LSP, which penetrates a lower portion of the electrode structure ES and is connected to the lower structure 101 (e.g., the semiconductor layer of the lower structure 101 or the substrate 100), and an upper semiconductor pattern USP, which penetrates an upper portion of the electrode structure ES and is connected to the lower semiconductor pattern LSP. The upper semiconductor pattern USP has a closed bottom end that is in contact with the lower semiconductor pattern LSP. The upper semiconductor pattern USP may have a hollow pipe shape or a macaroni shape. The upper semiconductor pattern USP may be an impurity-doped semiconductor or an impurity-undoped intrinsic semiconductor. The lower semiconductor pattern LSP may include a semiconductor material of which conductivity is the same as that of the semiconductor layer (or of the substrate 100) of the lower structure 101. The lower semiconductor pattern LSP may have a pillar shape that protrudes from the lower structure 101. The lowermost gate electrode 150L is adjacent to the lower semiconductor pattern LSP, and the other gate electrodes 150 and 150U are adjacent to the upper semiconductor pattern USP.

Each of the vertical patterns VP includes a buried insulating pattern 170 and a vertical insulator 160. The buried insulating pattern 170 fills an inside of the upper semiconductor pattern USP. The vertical insulator 160 is disposed between the upper semiconductor pattern USP and the electrode structure ES. The buried insulating pattern 170 may include, for example, silicon oxide. The vertical insulator 160 may have a macaroni or pipe shape of which top and bottom ends are open. The vertical insulator 160 has a bottom surface in contact with the lower semiconductor pattern LSP.

The vertical insulator 160 may include a memory element of flash memory devices. Although not shown, the vertical insulator 160 may include a charge storage layer of flash memory devices. The vertical insulator 160 may include a charge storage layer and a tunnel insulating layer that are sequentially stacked. The tunnel insulating layer may be in direct contact with the upper semiconductor pattern USP, and the charge storage layer may be interposed between the tunnel insulating layer and the gate electrodes 150 and 150U. In some embodiments, the vertical insulator 160 may further include a blocking insulating layer between the charge storage layer and the gate electrodes 150 and 150U. The charge storage layer may include at least one silicon nitride layer or at least one silicon oxynitride layer. The tunnel insulating layer may include a material having a band gap greater than that of the charge storage layer. For example, the tunnel insulating layer may include a silicon oxide layer. The blocking insulating layer may include a material having a band gap greater than that of the charge storage layer. For example, the blocking insulating layer may include a silicon oxide layer, a silicon nitride layer, or a silicon oxynitride layer.

A gate dielectric pattern 158 is disposed between the lower semiconductor pattern LSP and the lowermost gate electrode 150L. The gate dielectric pattern 158 may include, for example, a silicon oxide layer.

A plurality of horizontal insulators 155 are on top and bottom surfaces of each of the gate electrodes 150L, 150, and 150U. Each of the horizontal insulators 155 extends between the vertical insulator 160 and each of the gate electrodes 150L, 150, and 150U, or between the gate dielectric pattern 158 and the lowermost gate electrode 150L. The horizontal insulators 155 may consist of a single thin layer or a plurality of thin layers. In some embodiments, the horizontal insulators 155 may each include a blocking insulating layer of charge trap-type flash memory transistors.

A plurality of conductive pads 180 are correspondingly on the vertical patterns VP. Each of the conductive pads 180 may be connected to the channel structure CH. The conductive pads 180 may include an impurity-doped semiconductor material or a conductive material.

The electrode structure ES is disposed between two adjacent common source regions of a plurality of common source regions 84. The common source regions 184 are in the lower structure 101 (e.g., the semiconductor layer of the lower structure 101 or the substrate 100) on opposite sides of the electrode structure ES and extend in the second direction D2. A plurality of side insulating spacers SP are correspondingly provided on opposite side surfaces of the electrode structure ES. The side insulating spacers SP may include, for example, silicon nitride. A plurality of common source plugs CSP are correspondingly provided on opposite sides of the electrode structure ES and are coupled to corresponding common source regions 184. The common source plugs CSP extend in the second direction D2 and are spaced apart from each other in the first direction D1 across the electrode structure ES. Each of the side insulating spacers SP is interposed between the electrode structure ES and one of the common source plugs CSP. The common source plugs CSP may include a conductive material.

An upper capping insulating layer 124 is provided on the electrode structure ES, covering a top surface of the electrode structure ES and top surfaces of the conductive pads 180. The upper capping insulating layer 124 has a top surface substantially coplanar with top surfaces of the common source plugs CSP. A first interlayer dielectric layer 126 is provided on the upper capping insulating layer 124, covering the top surfaces of the common source plugs CSP. The upper capping insulating layer 124 may include an insulating material (e.g., silicon oxide). The first interlayer dielectric layer 126 may include an insulating material (e.g., silicon oxide).

A plurality of lower contacts 190 are correspondingly provided on the conductive pads 180. Each of the lower contacts 190 penetrates the first interlayer dielectric layer 126 and the upper capping insulating layer 124 to be connected to a corresponding one of the conductive pads 180. The lower contacts 190 may include a conductive material.

A plurality of subsidiary conductive lines 192 are provided on the first interlayer dielectric layer 126. The subsidiary conductive lines 192 may be arranged along the first and second directions D1 and D2 on the first interlayer dielectric layer 126. The subsidiary conductive lines 192 may each have a bar shape having a longitudinal axis in the first direction D1. The subsidiary conductive lines 192 include a plurality of first subsidiary conductive lines 192a and a plurality of second subsidiary conductive lines 192b. On the electrode structure ES, each of the first subsidiary conductive lines 192a crosses over a corresponding one of the common source plugs CSP (or of the common source regions 184), and each of the second subsidiary conductive lines 192b crosses over the separation insulating pattern 182.

The subsidiary conductive lines 192 may be connected through the lower contacts 190 to the vertical patterns VP. Each of the first subsidiary conductive lines 192a may electrically connect a corresponding one of the vertical patterns VP of the electrode structure ES to a corresponding one of vertical patterns of a neighboring electrode structure. Although not shown, the neighboring electrode structure may be spaced apart from the electrode structure ES across one of the common source plugs CSP. Each of the second subsidiary conductive lines 192b may electrically connect two vertical patterns of the vertical patterns VP to each other. The two vertical patterns are spaced apart from each other across the separation insulating pattern 182, and respectively penetrate the two uppermost gate electrodes of the uppermost gate electrodes 150U. The subsidiary conductive lines 192 may include a conductive material. The first interlayer dielectric layer 126 is provided thereon with a second interlayer dielectric layer 128 that covers the subsidiary conductive lines 192. The second interlayer dielectric layer 128 may include an insulating material (e.g., silicon oxide).

A plurality of bit line 200 are provided on the second interlayer dielectric layer 128. The bit lines 200 extend in the first direction D1 and are spaced apart from each other in the second direction D2. The bit lines 200 may be connected through upper contacts 196 to the subsidiary conductive lines 192. For example, the upper contacts 196 are correspondingly provided on the subsidiary conductive lines 192. Each of the upper contacts 196 penetrates at least a portion of the second interlayer dielectric layer 128 to be connected to a corresponding one of the subsidiary conductive lines 192. Each of the upper contacts 196 is connected to a corresponding one of the bit lines 200. The upper contacts 196 may include a conductive material. The bit lines 200 may include a conductive material. The second interlayer dielectric layer 128 is provided thereon with a third interlayer dielectric layer 132 that covers the bit lines 200. The third interlayer dielectric layer 132 may have a top surface substantially coplanar with top surfaces of the bit lines 200. The third interlayer dielectric layer 132 may include an insulating material (e.g., silicon oxide).

The second memory section 20 may include a variable resistance memory cell structure. For example, the second memory section 20 includes a plurality of variable resistance memory cells VMC provided on the third interlayer dielectric layer 132. The variable resistance memory cells VMC are two-dimensionally arranged along the first and second directions D1 and D2 on the electrode structure ES, but the present inventive concepts are not limited thereto. As viewed in plan, the variable resistance memory cells VMC may be arranged in various configurations on the electrode structure ES. Each of the variable resistance memory cells VMC may be connected to a corresponding one of the bit lines 200. The second memory section 20 may share the bit lines 200 with the first memory section 10. The second memory section 20 may include a fourth interlayer dielectric layer 134 that is provided on the third interlayer dielectric layer 132 and covers the variable resistance memory cells VMC. The fourth interlayer dielectric layer 134 may have a top surface substantially coplanar with top surfaces of the variable resistance memory cells VMC. The fourth interlayer dielectric layer 134 may include an insulating material (e.g., silicon oxide). Each of the variable resistance memory cells VMC may include components corresponding to those of each of the first memory cells MC1 discussed with reference to FIGS. 1 to 12. For example, each of the variable resistance memory cells VMC may include the magnetic tunnel junction pattern MTJ, the bi-directional switching pattern SW, and the first, second, and third conductive patterns 310, 320, and 330 discussed with reference to FIGS. 3, 4, 5A, and 5B. Alternatively, each of the variable resistance memory cells VMC may include components corresponding to those of each of the first memory cells MC1 discussed with reference to FIGS. 6 to 12.

The second memory section 20 may include a plurality of conductive lines 250 provided on the fourth interlayer dielectric layer 134. The conductive lines 250 extend in the second direction D2 and are spaced apart from each other in the first direction D1. The conductive lines 250 cross over the bit lines 200. The variable resistance memory cells VMC are correspondingly provided at intersections between the bit lines 200 and the conductive lines 250 in a plan view. The variable resistance memory cells VMC arranged in the second direction D2 are correspondingly connected to the bit lines 200 and are connected in common to a corresponding one of the conductive lines 250. The conductive lines 250 may include a conductive material. Although not shown, the second memory section 20 may further include additional conductive lines, which are on and run across the conductive lines 250, and additional variable resistance memory cells VMC, which may be correspondingly provided at intersections between the conductive lines 250 and the additional conductive lines in a plan view. In this case, the second memory section 20 may have a cross-point cell array structure in which the variable resistance memory cells VMC are three-dimensionally arranged along the first to third directions D1 to D3.

Figure 25:
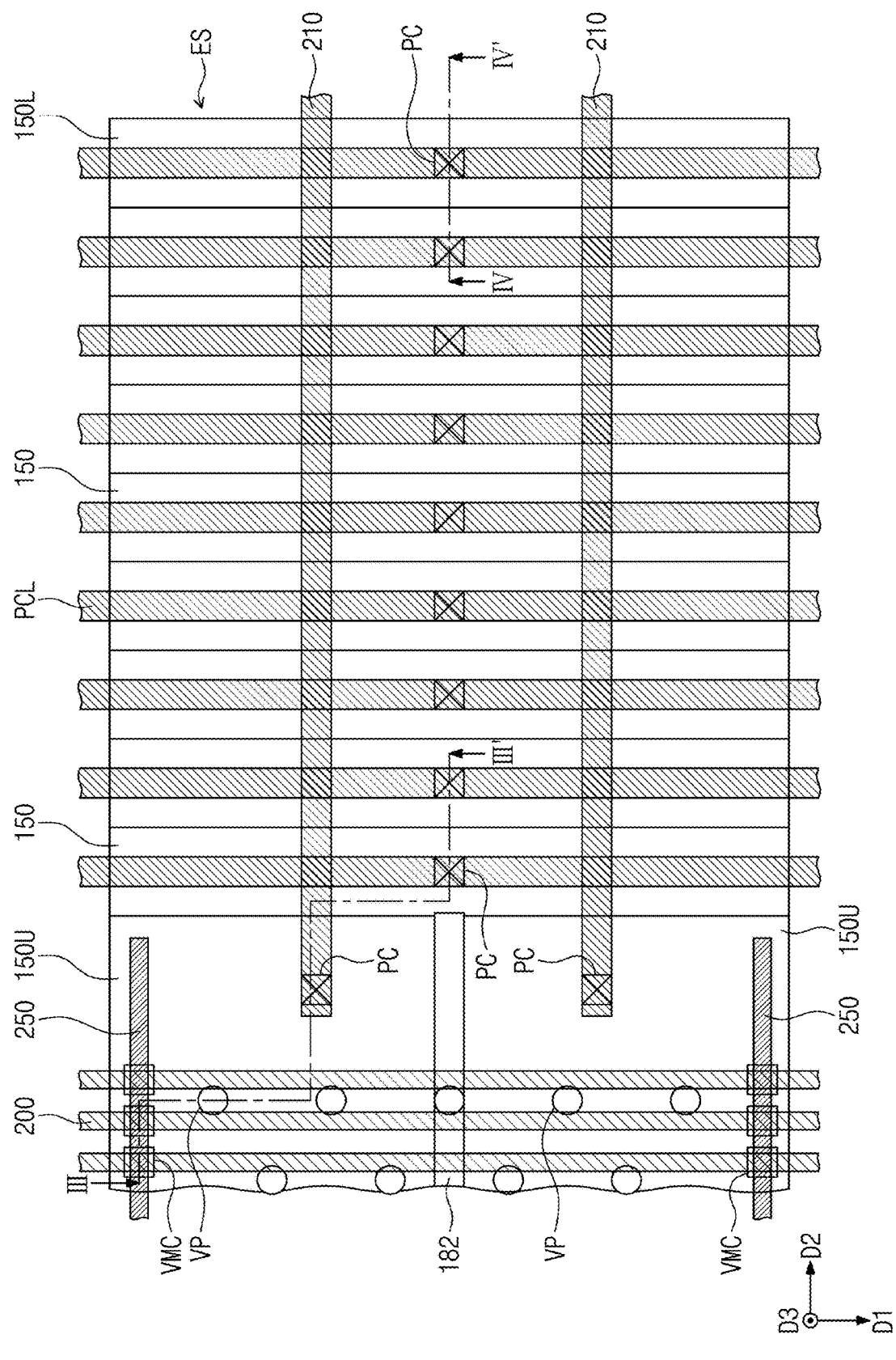
FIG. 25 illustrates a plan view illustrating a semiconductor device according to exemplary embodiments of the present inventive concepts.
Figure 26:
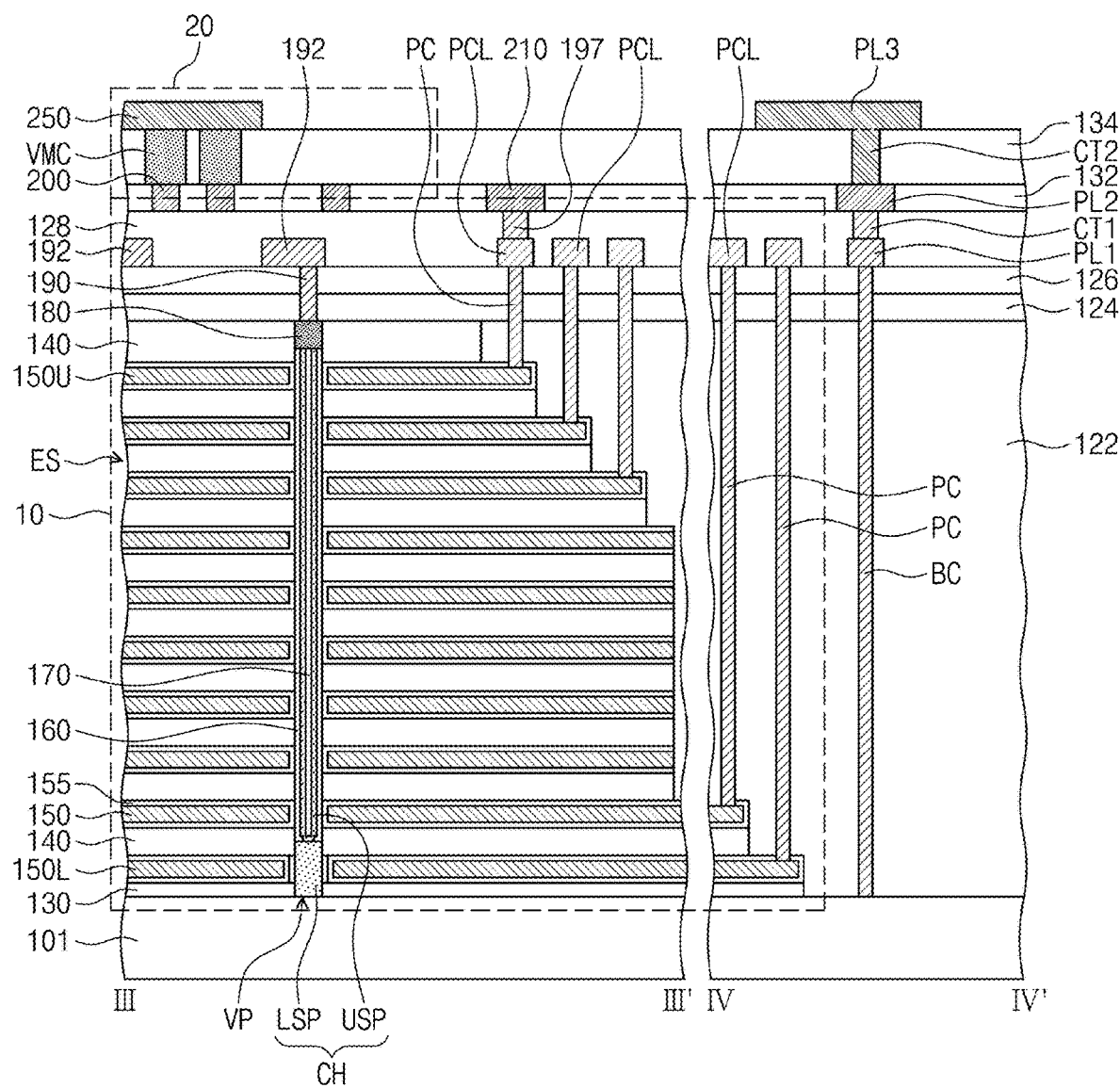
FIG. 26 illustrates a cross-sectional view taken along lines and IV-IV' of FIG. 25.

FIG. 25 illustrates a plan view illustrating a semiconductor device according to exemplary embodiments of the present inventive concepts. FIG. 26 illustrates a cross-sectional view taken along lines III-III' and IV-IV' of FIG. 25. The same technical features as those of the semiconductor device discussed with reference to FIGS. 23 and 24 may be omitted for brevity of description.

Referring to FIGS. 25 and 26, the electrode structure ES of the first memory section 10 extends in the second direction D2 and has a stepwise structure at its end portion. For example, each of the gate electrodes 150L, 150, and 150U extends in the second direction D2 and has an exposed end portion not covered with its overlying gate electrode 150L, 150, and 150U.

A lower capping insulating layer 122 is provided on the lower structure 101. The lower capping insulating layer 122 covers the stepwise-structured end portion of the electrode structure ES. The lower capping insulating layer 122 has a top surface substantially coplanar with a top surface of the electrode structure ES. For example, the top surface of the lower capping insulating layer 122 is substantially coplanar with that of an uppermost layer of a plurality of insulating layers 140 in the electrode structure ES. The upper capping insulating layer 124 and the first to fourth interlayer dielectric layers 126, 128, 132, and 134 extend along the top surface of the lower capping insulating layer 122. The lower capping insulating layer 122 may include an insulating material (e.g., silicon oxide).

The first memory section 10 includes a plurality of lower pad contacts PC and a plurality of lower pad lines PCL. The lower pad contacts PC are correspondingly provided on the end portions of the gate electrodes 150L, 150, and 150U. The lower pad contacts PC may be connected to the gate electrodes 150L, 150, and 150U. Each of the lower pad contacts PC penetrates the first interlayer dielectric layer 126, the upper capping insulating layer 124, and at least a portion of the lower capping insulating layer 122 and is in contact with a corresponding one of the end portions of the gate electrodes 150L, 150, and 150U. The lower pad contacts PC and the lower contacts 190 have their top surface substantially coplanar with that of the first interlayer dielectric layer 126. The lower pad contacts PC may include a conductive material.

The lower pad lines PCL are provided on the first interlayer dielectric layer 126. The lower pad lines PCL are correspondingly connected to the lower pad contacts PC. The lower pad lines PCL may be connected through the pad contacts PC to the gate electrodes 150L, 150, and 150U. The lower pad lines PCL extend in the first direction D1 and are spaced apart from each other in the second direction D2. The lower pad lines PCL and the subsidiary conductive lines 192 are positioned at substantially the same height from a bottom surface of the lower structure 101. The lower pad lines PCL may include the same material as those of the subsidiary conductive lines 192. The second interlayer dielectric layer 128 covers the lower pad lines PCL and the subsidiary conductive lines 192.

The first memory section 10 includes a plurality of upper pad lines 210, which are provided on the second interlayer dielectric layer 128, and a plurality of upper pad contacts 197, which are correspondingly connected to the upper pad line 210. The upper pad lines 210 extend in the second direction D2 and are spaced apart from each other in the first direction D1. The upper pad lines 210 may be connected respectively to the two uppermost gate electrodes of the uppermost gate electrodes 150U. Each of the upper pad lines 210 may be connected through a corresponding one of the upper pad contacts 197 to a corresponding one of the two uppermost gate electrodes of the uppermost gate electrodes 150U. The upper pad contacts 197 penetrate at least a portion of the second interlayer dielectric layer 128 to be connected to a corresponding one of the lower pad lines PCL. Each of the upper pad contacts 197 is connected to a corresponding one of the upper pad lines 210. The upper pad contacts 197 may be positioned at substantially the same height from the bottom surface of the lower structure 101 as those of the upper contacts 196 discussed with reference to FIGS. 23 and 24. For example, each of the upper pad contacts 197 may have a top surface substantially coplanar with a top surface of the second interlayer dielectric layer 128, and each of the upper contacts 196 may have a top surface substantially coplanar with the top surface of the second interlayer dielectric layer 128. The upper pad contacts 197 may include the same material as that of the upper contacts 196. The upper pad lines 210 and the bit lines 200 are provided at substantially the same level from the bottom surface of the lower structure 101 and may include the same material as each other. The bit lines 200 and the upper pad lines 210 penetrate the third interlayer dielectric layer 132. The top surface of the third interlayer dielectric layer 132 is substantially coplanar with top surfaces of the bit lines 200 and top surfaces of the upper pad lines 210. The fourth interlayer dielectric layer 134 covers the top surfaces of the bit lines 200 and the top surfaces of the upper pad lines 210.

Although not shown, the gate electrodes 150L, 150, and 150U may be connected through the lower pad contacts PC, the lower pad lines PCL, the upper pad contact 197, and the upper pad lines 210 to the row decoder of the peripheral circuit section 30 discussed with reference to FIGS. 21A, 21B, 22A, and 22B. The bit lines 200 may be connected to a page buffer of the peripheral circuit section 30.

A buried contact BC is provided on the lower structure 101. The buried contact BC is provided on a side of the electrode structure ES of the first memory section 10, and penetrates the lower capping insulating layer 122, the upper capping insulating layer 124, and the first interlayer dielectric layer 126. The buried contact BC may be connected to the peripheral circuit section 30 discussed with reference to FIGS. 21A, 21B, 22A, and 22B. The buried contact. BC may be a single conductive contact or a plurality of conductive contacts that are connected to each other. The buried contact BC has a top surface at substantially the same height from the bottom surface of the lower structure 101 as those of the top surfaces of the lower pad contacts PC and those of the top surfaces of the lower contacts 190. The top surface of the first interlayer dielectric layer 126 may be substantially coplanar with that of the buried contact BC, those of the lower pad contacts PC, and those of the lower contacts 190. The buried contact BC may include a conductive material.

The first interlayer dielectric layer 126 is provided thereon with a first peripheral electric line PL1 connected to the buried contact BC. The first peripheral electric line PL1 is positioned at substantially the same height from the bottom surface of the lower structure 101 as those of the lower pad lines PCL and those of the subsidiary conductive lines 192. The first peripheral electric line PL1 may include the same material as those of the lower pad lines PCL and those of the subsidiary conductive lines 192. The second interlayer dielectric line 128 covers the first peripheral electric line PL1. A first peripheral conductive contact CT1 penetrates at least a portion of the second interlayer dielectric layer 128 to be connected to the first peripheral electric line PL1. The first peripheral conductive contact CT1 is positioned at substantially the same height from the bottom surface of the lower structure 101 as that of the upper pad contact 197 and those of the upper contacts 196. The first peripheral conductive contact CT1 may include the same material as that of the upper pad contact 197 and those of the upper contacts 196.

The second interlayer dielectric layer 128 is provided thereon with a second peripheral electric line PL2 connected to the first peripheral conductive contact CT1. The second peripheral electric line PL2 is positioned at substantially the same height from the bottom surface of the lower structure 101 as those of the bit lines 200 and those of the upper pad lines 210. The second peripheral electric line PL2 may include the same material as those of the bit lines 200 and the upper pad lines 210. The second peripheral electric line PL2 penetrates the third interlayer dielectric layer 132 to be connected to the first peripheral conductive contact CT1. For example, the third interlayer dielectric layer 132 surrounds the second peripheral electric line PL2. The second peripheral electric line PL2 has a top surface substantially coplanar with those of the bit lines 200, those of the upper pad lines 210, and that of the third interlayer dielectric layer 132. The fourth interlayer dielectric layer 134 covers the top surface of the second peripheral electric line PL2.

A second peripheral conductive contact CT2 penetrates the fourth interlayer dielectric layer 134 to be connected to the second peripheral electric line PL2. The second peripheral conductive contact CT2 is positioned at substantially the same height from the bottom surface of the lower structure 101 as those of the variable resistance memory cells VMC of the second memory section 20. The fourth interlayer dielectric layer 134 is provided thereon with a third peripheral electric line PL3 connected to the second peripheral conductive contact CT2. The third peripheral electric line PL3 is positioned at substantially the same height from the bottom surface of the lower structure 101 as those of the conductive lines 250 of the second memory section 20. The third peripheral electric line PL3 and the second peripheral conductive contact CT2 may include the same material (e.g., copper) as each other. The third peripheral electric line PL3 and the second peripheral conductive contact CT2 are in contact with each other without an intervening layer therebetween.

Figure 27:
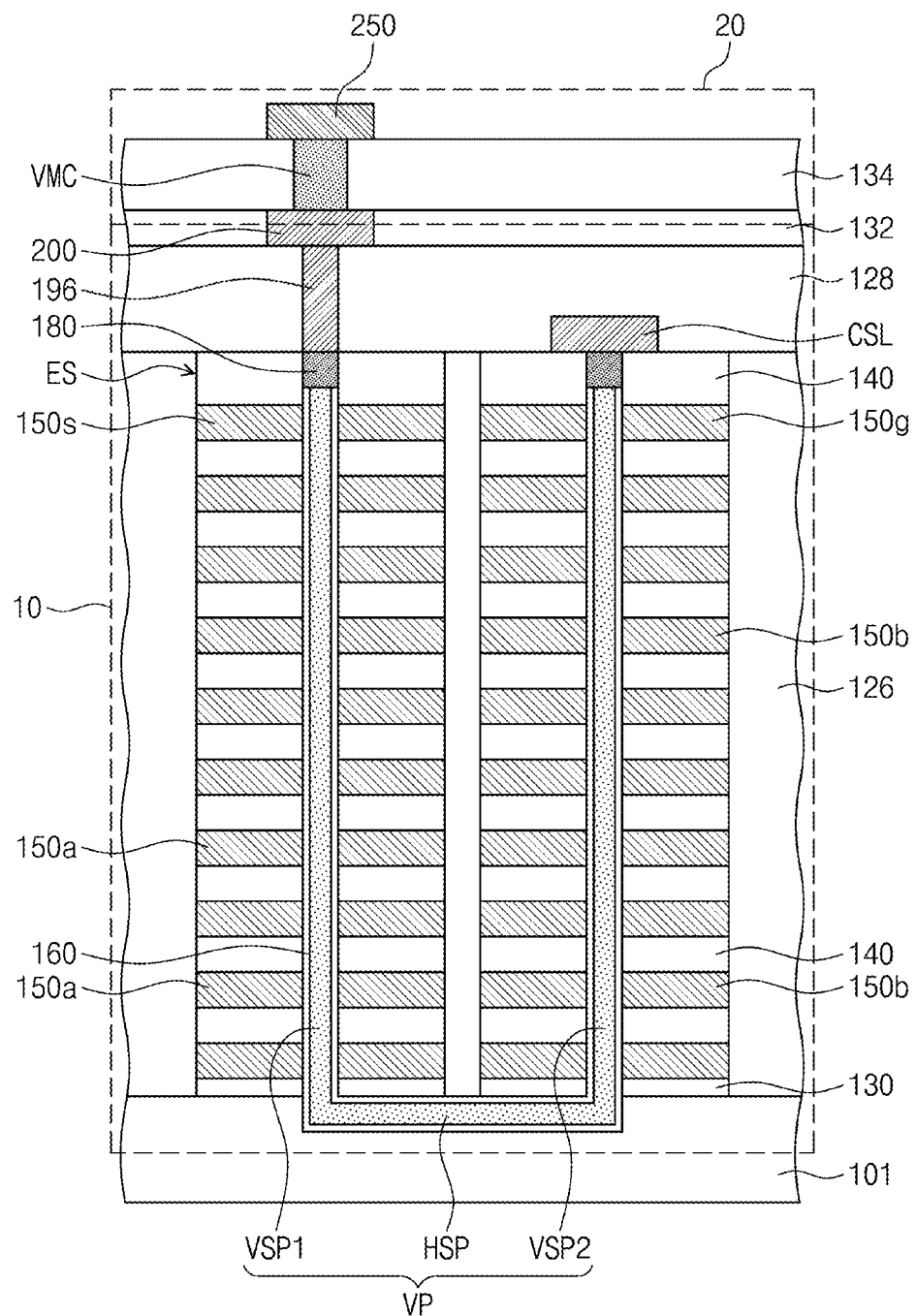
FIG. 27 illustrates a cross-sectional view showing a cell array of a semiconductor device according to exemplary embodiments of the present inventive concepts.

FIG. 27 illustrates a cross-sectional view showing a cell array of a semiconductor device according to exemplary embodiments of the present inventive concepts. Like reference numerals are used to refer to components the same as those of the cell array of the semiconductor device discussed with reference to FIGS. 23 and 24, and a difference is chiefly described for brevity of description.

Referring to FIG. 27, a first memory section 10 includes a three-dimensional NAND flash memory cell structure provided on a lower structure 101. For example, a bit line 200 is provided on the lower structure 101, and an electrode structure ES is provided between the lower structure 101 and the bit line 200. A common source line CSL is provided at a height between that of the electrode structure ES and that of the bit line 200. The vertical pattern VP penetrates the electrode structure ES and electrically connects the bit line 200 to the common source line CSL.

The electrode structure ES includes a plurality of upper cell gate electrodes 150a sequentially stacked on the lower structure 101 and a plurality of lower cell gate electrodes 150b sequentially stacked on the lower structure 101. The electrode structure ES further includes a plurality of select gate electrodes that are disposed on the upper cell gate electrodes 150a and the lower cell gate electrodes 150b. The select gate electrodes may include a string select gate electrode 150s, which is between the bit line 200 and the upper cell gate electrodes 150a, and a ground select gate electrode 150g, which is between the common source line CSL and the lower cell gate electrodes 150b. The string select gate electrode 150s is horizontally spaced apart from the ground select gate electrode 150g. The upper cell gate electrodes 150a are between the lower structure 101 and the string select gate electrode 150s. The lower cell gate electrodes 150b are between the lower structure 101 and the ground select gate electrode 150g. The upper cell gate electrodes 150a may be horizontally spaced apart from the lower cell gate electrodes 150b.

The vertical pattern VP includes a first vertical semiconductor pattern VSP1, a second vertical semiconductor pattern VSP2, and a horizontal semiconductor pattern HSP. The first vertical semiconductor pattern VSP1 penetrates the string select gate electrode 150s and the upper cell gate electrodes 150a of the electrode structure ES. The second vertical semiconductor pattern VSP2 penetrates the ground select gate electrode 150g and the lower cell gate electrodes 150b of the electrode structure ES. The horizontal semiconductor pattern HSP lies below the electrode structure ES and connects the first vertical semiconductor pattern VSP1 to the second vertical semiconductor pattern VSP2. The second vertical semiconductor pattern VSP2 is connected to the common source line CSL, and the first vertical semiconductor pattern VSP1 is connected to the bit line 200. The horizontal semiconductor pattern HSP is provided between the lower structure 101 and the electrode structure ES, connecting the first vertical semiconductor patterns VSP1 and the second vertical semiconductor pattern VSP2 to each other. The second vertical semiconductor pattern VSP2 penetrates the lower cell gate electrodes 150b and the ground select gate electrode 150g to be connected to the common source line CSL, and the first vertical semiconductor pattern VSP1 penetrates the upper cell gate electrodes 150a and the string select gate electrode 150s to be connected to the bit line 200. The horizontal semiconductor pattern HSP extends to below the lower cell gate electrodes 150b from below the upper cell gate electrodes 150a, thereby connecting the first vertical semiconductor pattern VSP1 and the second vertical semiconductor pattern VSP2.

The vertical insulator 160 is interposed between the electrode structure ES and the vertical pattern VP. The vertical insulator 160 extends between the vertical pattern VP and the lower structure 101. The vertical insulator 160 may include a tunnel insulating layer, a charge storage layer, and a blocking insulating layer that sequentially cover an outer surface of the vertical pattern VP.

The conductive pads 180 may be correspondingly provided on the first vertical semiconductor pattern VSP1 and the second vertical semiconductor pattern VSP2. The conductive pads 180 may be connected to the vertical pattern VP. Although not shown, the lower structure 101 may be provided therein with a back gate transistor BGT, discussed with reference to FIG. 18, that selectively controls a charge flow passing through the horizontal semiconductor pattern HSP of the vertical pattern VP.

The lower structure 101 is provided thereon with the first interlayer dielectric layer 126 that covers the electrode structure ES. The second interlayer dielectric layer 128 is provided on the first interlayer dielectric layer 126. The common source line CSL is provided in the second interlayer dielectric layer 128 and connected to one of the conductive pads 180 connected to the second vertical semiconductor pattern VSP2. The common source line CSL may be connected through the one of the conductive pads 180 to one of the second vertical semiconductor pattern VSP2.

The bit line 200 may be provided on the second interlayer dielectric layer 128. The bit line 200 is connected through the upper contact 196 to a conductive pad 180 that is connected to the first vertical semiconductor pattern VSP1. The upper contact 196 penetrates the second interlayer dielectric layer 128 to be connected to the bit line 200. The bit line 200 is connected through the corresponding conductive pad 180 and the upper contact 196 to the first vertical semiconductor pattern VSP1. The second interlayer dielectric layer 128 is provided thereon with the third interlayer dielectric layer 132 that surrounds the bit line 200.

The second memory section 20 includes a variable resistance memory cell structure. For example, the second memory section 20 includes the variable resistance memory cell VMC provided on the third interlayer dielectric layer 132. The variable resistance memory cell VMC is connected to the bit line 200. The second memory section 20 shares the bit line 200 with the first memory section 10. The second memory section 20 includes the fourth interlayer dielectric layer 134 that is provided on the third interlayer dielectric layer 132 and surrounds the variable resistance memory cell VMC. For example, the variable resistance memory cell VMC penetrates the third interlayer dielectric layer 132. The second memory section 20 includes the conductive line 250 provided on the fourth interlayer dielectric layer 134. The variable resistance memory cell VMC is interposed between the bit line 200 and the conductive line 250 and is connected to the bit line 200 and the conductive line 250. The variable resistance memory cell VMC may include components corresponding to those of each of the first memory cells MC1 discussed with reference to FIGS. 1 to 12. For example, the variable resistance memory cell VMC may include the magnetic tunnel junction pattern MTJ, the bi-directional switching pattern SW, and the first, second, and third conductive patterns 310, 320, and 330 discussed with reference to FIGS. 3, 4, 5A, and 5B. Alternatively, the variable resistance memory cell VMC may include components corresponding to those of each of the first memory cells MC1 discussed with reference to FIGS. 6 to 12.

According to the present inventive concepts, a magnetic tunnel junction pattern and a bi-directional switching pattern may be coupled in series between a pair of conductive lines, and the bi-directional switching pattern may exhibit bi-directional switching characteristics at a relatively low temperature. Accordingly, it may be possible to minimize or reduce deterioration in characteristics of the magnetic tunnel junction pattern and to provide a semiconductor device having increased integration.

Furthermore, in some embodiments, a single substrate may include thereon a first memory section and a second memory section, which are vertically stacked and which have different operating characteristics from each other. The first and second memory sections may share bit lines. For example, the first memory section includes flash memory cells correspondingly connected to the bit lines, and the second memory section includes variable resistance memory cells correspondingly connected to the bit lines. Thus, the first memory section and the second memory section may be vertically stacked on the single substrate. As a result, a semiconductor device may be easily provided to have high integration with a reduced vertical profile.

While the present inventive concepts have been shown and described with reference to exemplary embodiments thereof, it will be apparently to those of ordinary skill in the art that various changes in form and detail may be made therein without departing from the spirit and scope of the inventive concepts as defined by the following claims.

What is claimed is:
1. A semiconductor device, comprising:
a first memory section and a second memory section that are sequentially stacked in a vertical direction on a top surface of a substrate,
wherein the first memory section comprises:
 an electrode structure including
  a plurality of gate electrodes that are stacked along the vertical direction on the top surface of the substrate, and
  a plurality of insulating layers that are stacked alternating the plurality of gate electrodes along the vertical direction on the top surface of the substrate;
 a bit line on the electrode structure;
 a common source line on the electrode structure;
 a vertical pattern penetrating the electrode structure, the vertical pattern electrically connecting the bit line to the common source line;
 a vertical insulator conformal along an outer surface of the vertical pattern, the vertical insulator having an upper surface at a same height as an upper surface of the vertical pattern;
 a first conductive pad connecting the vertical pattern to the common source line; and a second conductive pad connecting the vertical pattern to an upper contact, the upper contact connecting to the bit line, wherein the second memory section comprises:
a conductive line on the bit line; and
a variable resistance memory cell between the bit line and the conductive line, wherein the variable resistance memory cell comprises:
a magnetic tunnel junction pattern; and
a bi-directional switching pattern connected in series to the magnetic tunnel junction pattern, wherein the variable resistance memory cell are positioned at a height from the substrate between that of the bit line and that of the conductive line, and a width of the vertical pattern and the vertical insulator is equal to a width of the first conductive pad, a width of the vertical pattern and the vertical insulator is equal to a width of the second conductive pad, and the upper surface of the vertical pattern contacting a bottom surface of the first conductive pad is above an uppermost gate electrode of the plurality of gate electrodes, and the bottom surface of the first conductive pad is below an upper surface of an uppermost insulating layer of the plurality of insulating layers directly on the uppermost gate electrode of the plurality of gate electrodes.

2. The semiconductor device of claim 1, wherein the variable resistance memory cell is connected to the bit line and the conductive line.

3. The semiconductor device of claim 1, wherein the plurality of gate electrodes include:
upper cell gate electrodes that are stacked along the vertical direction on the top surface of the substrate;
lower cell gate electrodes that are stacked along the vertical direction on the top surface of the substrate, the lower cell gate electrodes horizontally spaced apart from the upper cell gate electrodes;
a string select gate electrode between the bit line and the upper cell gate electrodes; and
a ground select gate electrode between the common source line and the lower cell gate electrodes.

4. The semiconductor device of claim 3, wherein the vertical pattern includes:
a first vertical semiconductor pattern penetrating the string select gate electrode and the upper cell gate electrodes;
a second vertical semiconductor pattern penetrating the ground select gate electrode and the lower cell gate electrodes; and
a horizontal semiconductor pattern below the electrode structure, the horizontal semiconductor pattern connecting the first vertical semiconductor pattern to the second vertical semiconductor pattern.

5. The semiconductor device of claim 4, wherein the first vertical semiconductor pattern is connected to the bit line, and the second vertical semiconductor pattern is connected to the common source line.

6. The semiconductor device of claim 5, wherein the common source line is positioned at a height from the substrate between that of the electrode structure and that of the bit line.

7. The semiconductor device of claim 1, wherein the bi-directional switching pattern comprises a chalcogen element.

8. The semiconductor device of claim 1, wherein the variable resistance memory cell further comprises:

a conductive pattern between the magnetic tunnel junction pattern and the bi-directional switching pattern.

9. The semiconductor device of claim 8, wherein at least a portion of the conductive pattern is amorphous.

10. The semiconductor device of claim 8, wherein the conductive pattern comprises metal nitride.

11. The semiconductor device of claim 10, wherein the conductive pattern further comprises carbon.

12. The semiconductor device of claim 8, wherein the variable resistance memory cell further comprises:
a first electrode spaced apart from the conductive pattern across the magnetic tunnel junction pattern; and
a second electrode spaced apart from the conductive pattern across the bi-directional switching pattern.

13. A semiconductor device, comprising:
a first memory section and a second memory section that are sequentially stacked in a vertical direction on a top surface of a substrate, wherein the first memory section comprises:
an electrode structure including a plurality of gate electrodes that are stacked along the vertical direction on the top surface of the substrate;
a bit line on the electrode structure;
a common source line on the electrode structure, the common source line positioned at a height from the substrate between that of the electrode structure and that of the bit line; and
a vertical pattern penetrating the electrode structure, the vertical pattern electrically connecting the bit line to the common source line;
a first conductive pad connecting the vertical pattern to the common source line; and
a second conductive pad connecting the vertical pattern to an upper contact, the upper contact connecting to the bit line, wherein the second memory section comprises:
a conductive line on the bit line; and
a variable resistance memory cell between the bit line and the conductive line, the variable resistance memory cell connected to the bit line and the conductive line, wherein the variable resistance memory cell comprises:
a magnetic tunnel junction pattern; and
a bi-directional switching pattern connected in series to the magnetic tunnel junction pattern, wherein the bit line and the common source line are positioned at a height from the substrate between that of the electrode structure and that of the variable resistance memory cell, and an upper surface of the vertical pattern contacting a bottom surface of the first conductive pad is above an uppermost gate electrode of the plurality of gate electrodes, wherein the bit line is connected to the upper contact and the variable resistan ce memory cell in common.

14. The semiconductor device of claim 13, wherein the plurality of gate electrodes include:
upper cell gate electrodes that are stacked along the vertical direction on the top surface of the substrate;
lower cell gate electrodes that are stacked along the vertical direction on the top surface of the substrate, the lower cell gate electrodes horizontally spaced apart from the upper cell gate electrodes;
a string select gate electrode between the bit line and the upper cell gate electrodes; and
a ground select gate electrode between the common source line and the lower cell gate electrodes.

15. The semiconductor device of claim 14, wherein the vertical pattern includes:
- a first vertical semiconductor pattern penetrating the string select gate electrode and the upper cell gate electrodes;
- a second vertical semiconductor pattern penetrating the ground select gate electrode and the lower cell gate electrodes; and
- a horizontal semiconductor pattern below the electrode structure, the horizontal semiconductor pattern connecting the first vertical semiconductor pattern to the second vertical semiconductor pattern.

16. The semiconductor device of claim 15, wherein the first vertical semiconductor pattern is connected to the bit line, and the second vertical semiconductor pattern is connected to the common source line.

17. The semiconductor device of claim 13, wherein the bi-directional switching pattern comprises a chalcogenide material of which at least a portion is amorphous.

18. The semiconductor device of claim 13, wherein the variable resistance memory cell further comprises:
- a conductive pattern between the magnetic tunnel junction pattern and the bi-directional switching pattern.

19. The semiconductor device of claim 18, wherein the variable resistance memory cell further comprises:
- a first electrode spaced apart from the conductive pattern across the magnetic tunnel junction pattern; and
- a second electrode spaced apart from the conductive pattern across the bi-directional switching pattern.

20. The semiconductor device of claim 1,
wherein, the bit line is connected to the upper contact and the variable resistance memory cell in common.

* * * * *